United States Patent
Lee et al.

(10) Patent No.: US 12,200,933 B2
(45) Date of Patent: Jan. 14, 2025

(54) 3D AND FLASH MEMORY DEVICE

(71) Applicant: MACRONIX International Co., Ltd., Hsinchu (TW)

(72) Inventors: Cheng-Yu Lee, Taoyuan (TW); Teng-Hao Yeh, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 451 days.

(21) Appl. No.: 17/570,172

(22) Filed: Jan. 6, 2022

(65) Prior Publication Data
US 2023/0217655 A1 Jul. 6, 2023

(51) Int. Cl.
*H10B 43/20* (2023.01)
*H10B 41/27* (2023.01)
*H10B 43/10* (2023.01)
*H10B 43/27* (2023.01)

(52) U.S. Cl.
CPC ............. *H10B 43/27* (2023.02); *H10B 41/27* (2023.02); *H10B 43/10* (2023.02); *H10B 43/20* (2023.02)

(58) Field of Classification Search
CPC ........ H10B 43/27; H10B 41/27; H10B 43/20; H10B 43/10; H01L 29/40117; H01L 29/41725; H01L 23/5386; H01L 27/2454; H01L 29/7827; H01L 21/823487; H01L 21/823885; H01L 29/792–7926; Y02D 10/00; G11C 5/02–05
See application file for complete search history.

(56) References Cited

U.S. PATENT DOCUMENTS

| | | | |
|---|---|---|---|
| 11,749,344 B2* | 9/2023 | Harari | H10B 43/40 365/163 |
| 2020/0098774 A1* | 3/2020 | Yeh | H10B 43/10 |
| 2020/0381450 A1* | 12/2020 | Lue | H10B 43/27 |
| 2021/0074726 A1* | 3/2021 | Lue | H10B 51/30 |
| 2021/0375919 A1* | 12/2021 | Wang | H01L 23/5226 |
| 2022/0302164 A1* | 9/2022 | Ino | H01L 29/40117 |

FOREIGN PATENT DOCUMENTS

TW 201630146 8/2016
TW 202111925 3/2021

OTHER PUBLICATIONS

"Office Action of Taiwan Counterpart Application", issued on Aug. 25, 2022, p. 1-p. 5.

* cited by examiner

*Primary Examiner* — Suberr L Chi
*Assistant Examiner* — Illiam C. Trice, III
(74) *Attorney, Agent, or Firm* — J.C. PATENTS

(57) ABSTRACT

A three-dimensional AND flash memory device includes a gate stack structure and a silt. The silt extends along a first direction and divides the gate stack structure into a plurality of sub-blocks. Each sub-block includes a plurality of rows, and each row includes a plurality of channel pillars, a plurality of charge storage structures, and a plurality of pairs of conductive pillars. The plurality of pairs of conductive pillars are arranged in the plurality of channel pillars and penetrate the gate stack structure, and are respectively connected to the plurality of channel pillars. Each pair of conductive pillars includes a first conductive pillar and a second conductive pillar separated from each other along a second direction. There is an acute angle between the second direction and the first direction.

8 Claims, 24 Drawing Sheets

3D AND FLASH MEMORY DEVICE

BACKGROUND

Technical Field

The embodiment of the disclosure relates to a semiconductor device and a method of fabricating the same, and particularly, to a 3D AND flash memory device and a method of fabricating the same.

Description of Related Art

Since a non-volatile memory has the advantage that stored data does not disappear at power-off, it becomes a widely used memory for a personal computer or other electronics equipment. Currently, the three-dimensional (3D) memory commonly used in the industry includes a NOR memory and a NAND memory. In addition, another type of 3D memory is an AND memory, which may be applied to a multi-dimensional memory array with high integration and high area utilization, and has an advantage of a fast operation speed. Therefore, the development of a 3D memory device has gradually become the current trend.

SUMMARY

The disclosure provides a three-dimensional AND flash memory device and a fabrication method thereof, which can reduce the chip area or simplify the wiring complexity.

An embodiment of the disclosure provides a three-dimensional AND flash memory device including a gate stack structure and a slit. The gate stack structure is disposed on a dielectric substrate and includes a plurality of gate layers and a plurality of insulating layers alternately stacked with each other. The slit extends along a first direction and divides the gate stack structure into a plurality of sub-blocks. Each of the sub-blocks includes a plurality of rows. Each of the rows includes a plurality of channel pillars, a plurality of charge storage structures, and a plurality of pairs of conductive pillars. The channel pillars are disposed on the dielectric substrate and penetrate the gate stack structure. The charge storage structures are disposed between the gate layers and sidewalls of the channel pillars. The pairs of conductive pillars are disposed in the channel pillars, penetrate the gate stack structure, and are respectively connected to the channel pillars. Each of the pairs of conductive pillars includes a first conductive pillar and a second conductive pillar, and the first conductive pillar and the second conductive pillar are separated from each other along a second direction. An included angle between the second direction and the first direction is an acute angle.

An embodiment of the disclosure provides a three-dimensional AND flash memory device including a gate stack structure and a slit. The gate stack structure is disposed on a dielectric substrate and includes a plurality of gate layers and a plurality of insulating layers alternately stacked with each other. The slit extends along a first direction and divides the gate stack structure into a plurality of sub-blocks. Each of the sub-blocks includes a plurality of rows. Each of the rows includes a plurality of channel pillars, a plurality of charge storage structures, and a plurality of conductive pillars. The channel pillars are disposed on the dielectric substrate and penetrate the gate stack structure. The charge storage structures are disposed between the gate layers and sidewalls of the channel pillars. The conductive pillars are disposed in pairs in each of the channel pillars, penetrate the gate stack structure, and are respectively connected to the channel pillars. Each pair of the conductive pillars are arranged and separated from each other in a second direction, and the second direction and the first direction form a right angle. The three-dimensional AND flash memory device further includes a plurality of plugs, a plurality of first conductive lines, a plurality of vias, and a plurality of second conductive lines. The plugs are located on the conductive pillars, and each of the plugs lands on and is connected to a corresponding conductive pillar. The first conductive lines are located on the plugs, and each of the first conductive lines includes a first part and a second part. The first part extends along the first direction and is connected to a corresponding plug. The second part extends along the second direction and is connected to the first part. The vias are located on the first conductive lines, and each of the vias lands on the second part. The second conductive lines are connected to the vias, extend along the second direction, and are arranged along the first direction.

Based on the above, in the embodiments of the disclosure, source lines and bit lines may be formed through a multi-layer conductive interconnect, or source pillars and drain pillars may be arranged to form an acute angle with the slit. Therefore, the occupied chip area may be reduced or the wiring complexity may be reduced.

DESCRIPTION OF THE EMBODIMENTS

Figure 1A:
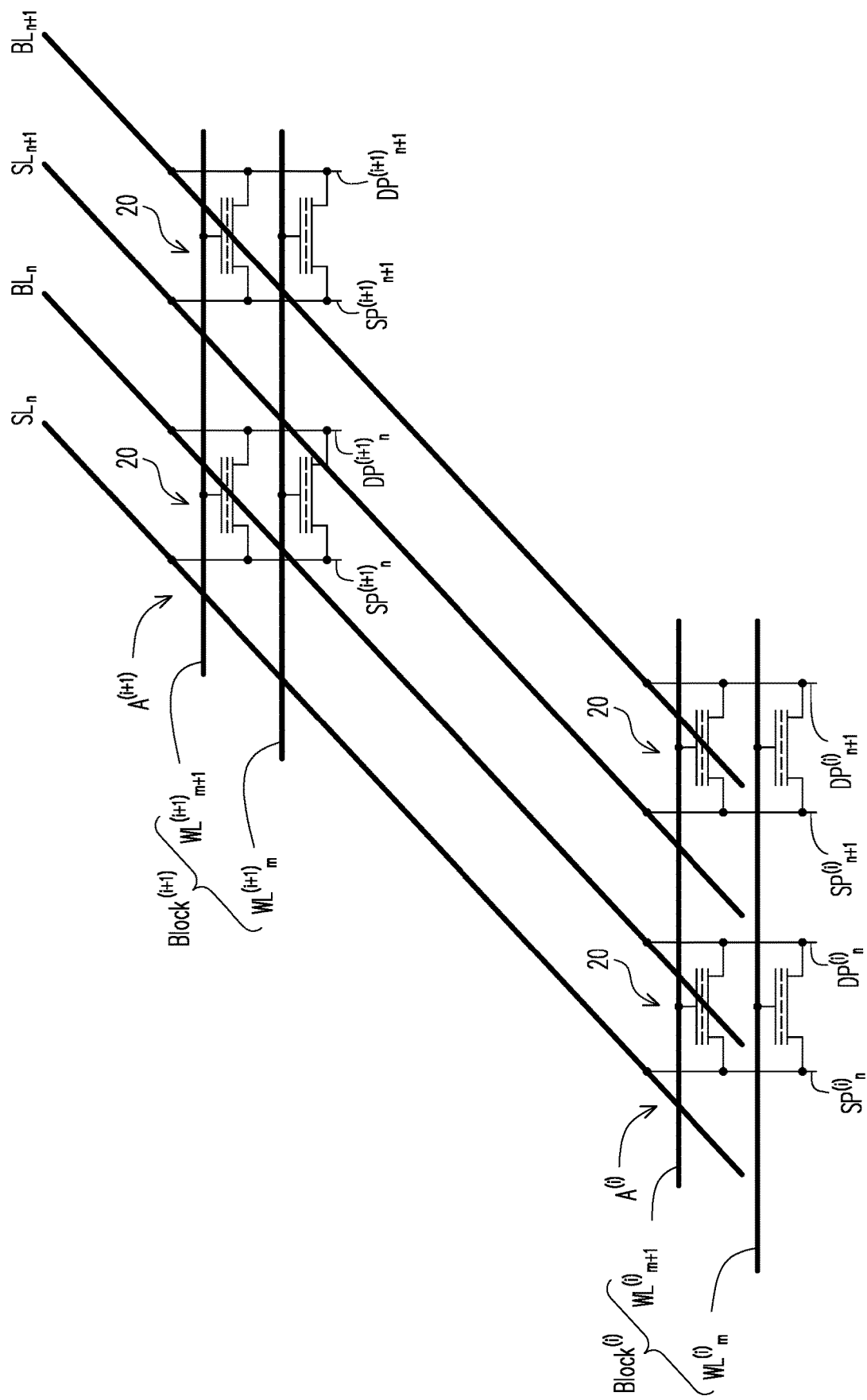
FIG. 1A shows a circuit diagram of a 3D AND flash memory array according to some embodiments.
Figure 1B:
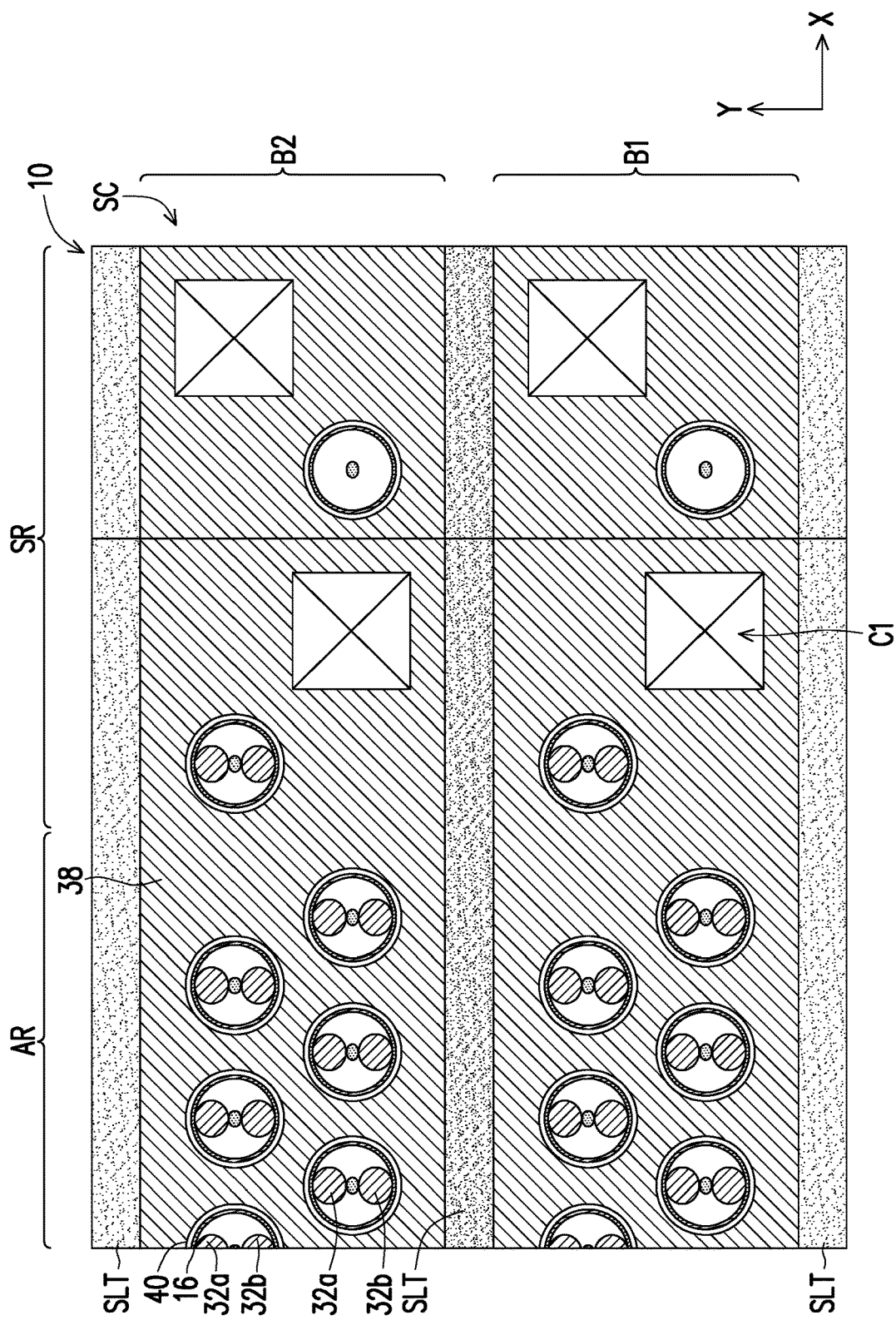
FIG. 1B shows a top view of a 3D AND flash memory array according to some embodiments.
Figure 1C:
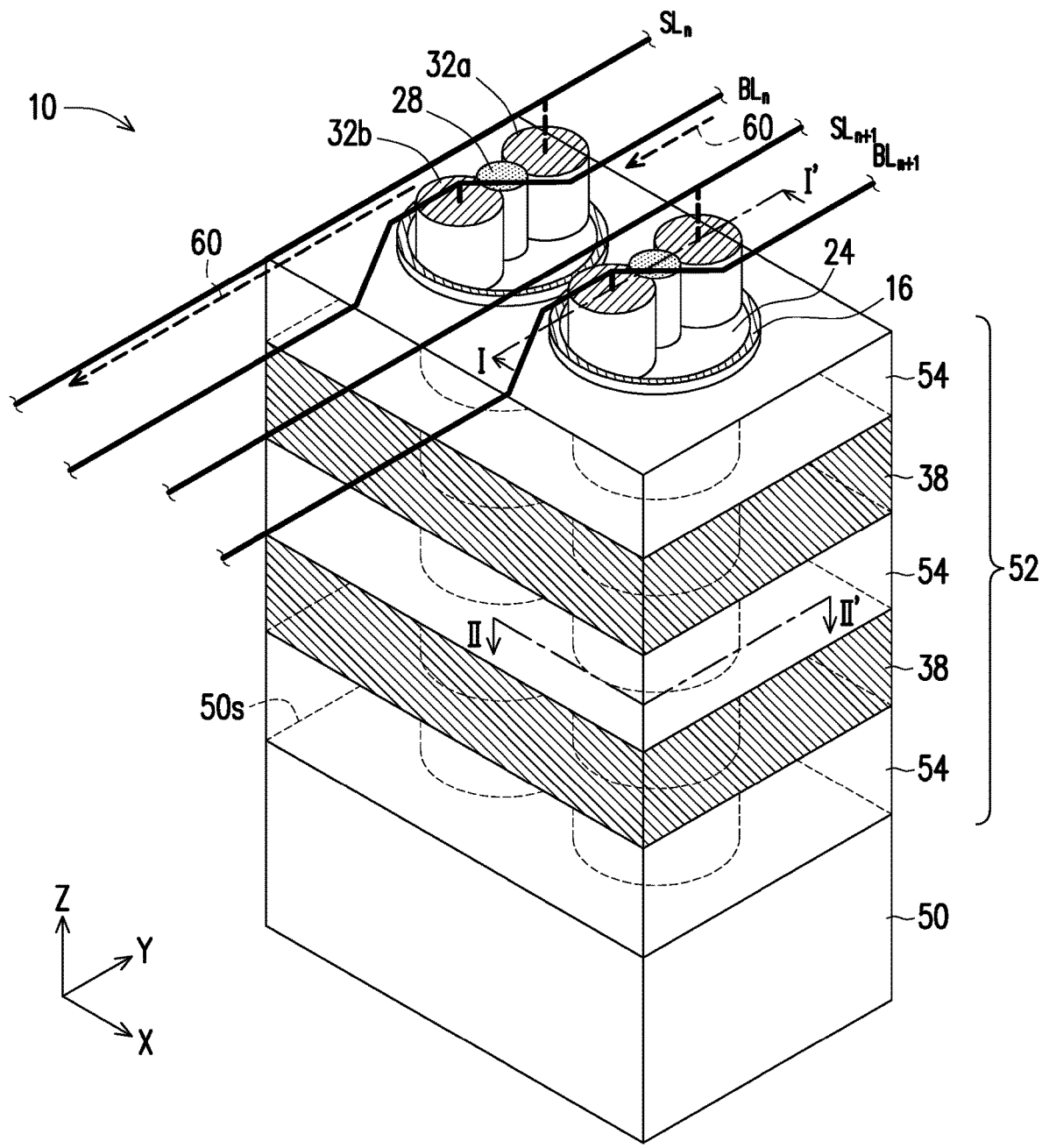
FIG. 1C shows a partial simplified perspective view of a part of the memory array in FIG. 1B.
Figure 1D:
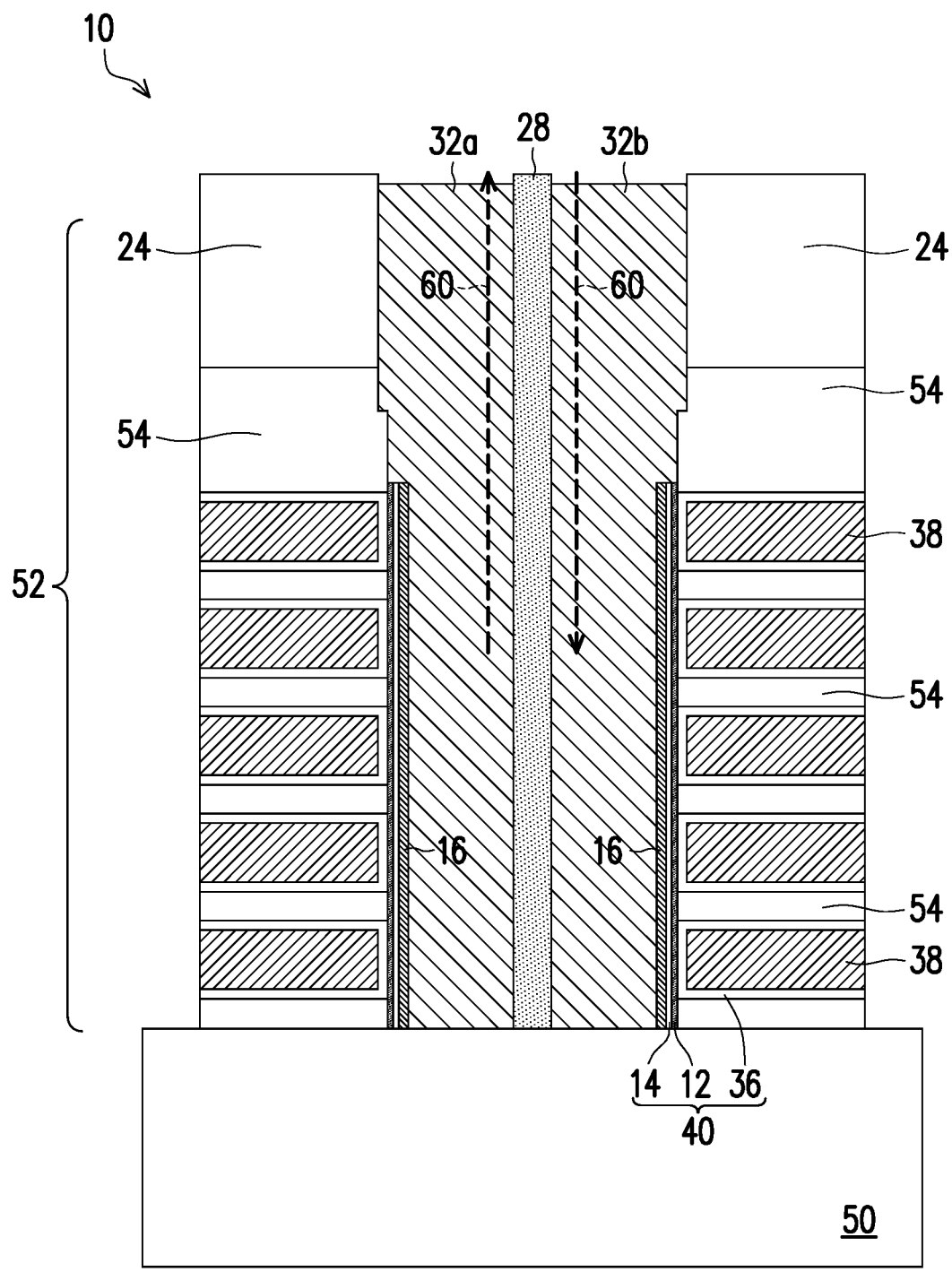
FIG. 1D and FIG. 1E show cross-sectional views taken along line I-I' of FIG. 1C.
Figure 1E:
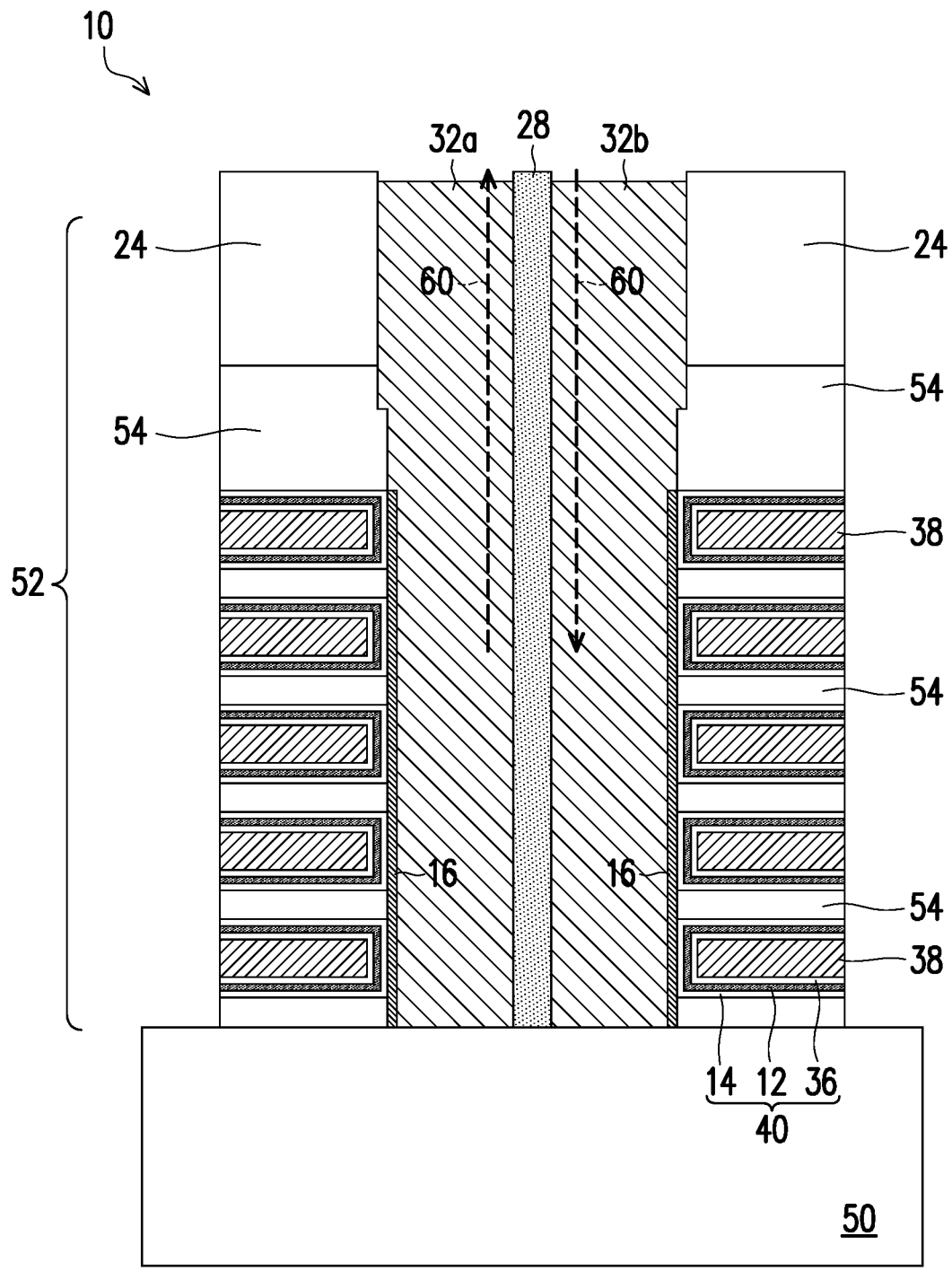
Figure 1F:
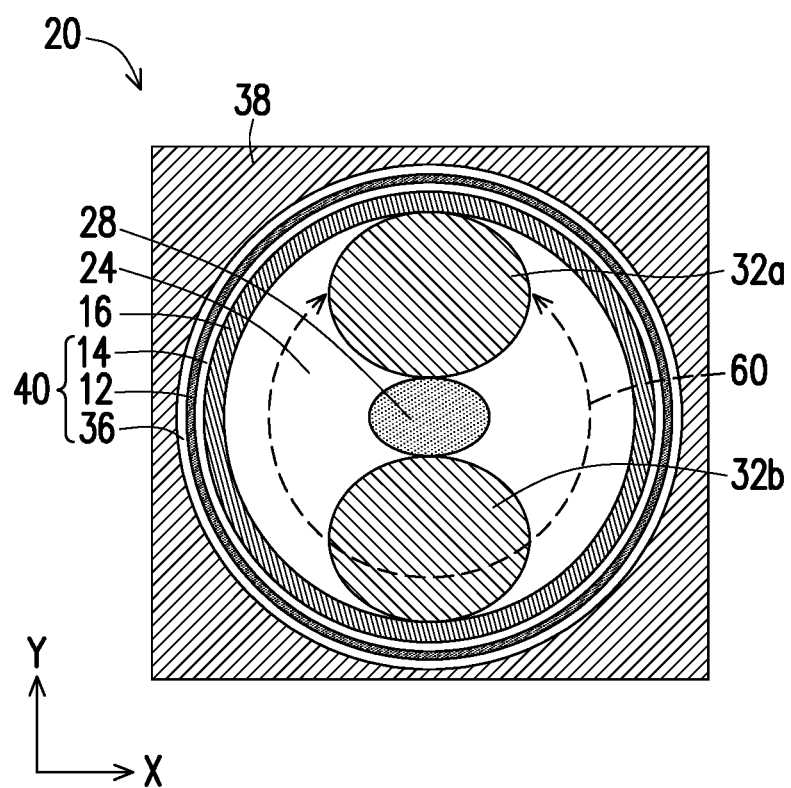
FIG. 1F shows a top view of line II-II' of FIG. 1C, FIG. 1D, and FIG. 1E.

FIG. 1A shows a circuit diagram of a 3D AND flash memory array according to some embodiments. FIG. 1B shows a top view of a 3D AND flash memory array according to some embodiments. FIG. 1C shows a partial simplified perspective view of the memory array in FIG. 1B. FIG. 1D and FIG. 1E show cross-sectional views taken along line I-I' of FIG. 1C. FIG. 1F shows a top view of line II-II' of FIG. 1C, FIG. 1D and FIG. 1E.

FIG. 1A shows a schematic view of two blocks BLOCK$^{(i)}$ and BLOCK$^{(i+1)}$ of a vertical AND memory array 10 arranged in rows and columns. The block BLOCK$^{(i)}$ includes a memory array A$^{(i)}$. A row (e.g., an $(m+1)^{th}$ row) of the memory array A$^{(i)}$ is a set of AND memory cells 20 having a common word line (e.g., WL$^{(i)}_{m+1}$). The AND memory cells 20 of the memory array $A^{(i)}$ in each row (e.g., the $(m+1)^{th}$ row) correspond to a common word line (e.g., $WL^{(i)}_{m+1}$) and are coupled to different source pillars (e.g., $SP^{(i)}_n$ and $SP^{(i)}_{n+1}$) and drain pillars (e.g., $DP^{(i)}_n$ and $DP^{(i)}_{n+1}$), so that the AND memory cells 20 are logically arranged in a row along the common word line (e.g., $WL^{(i)}_{m+1}$).

A column (e.g., an $n^{th}$ column) of the memory array $A^{(i)}$ is a set of AND memory cells 20 having a common source pillar (e.g., $SP^{(i)}_n$) and a common drain pillar (e.g., $DP^{(i)}_n$). The AND memory cells 20 of the memory array $A^{(i)}$ in each column (e.g., the $n^{th}$ column) correspond to different word lines (e.g., $WL^{(i)}_{m+1}$ and $WL^{(i)}_m$) and are coupled to a common source pillar (e.g., $SP^{(i)}_n$) and a common drain pillar (e.g., $DP^{(i)}_n$). Hence, the AND memory cells 20 of the memory array $A^{(i)}$ are logically arranged in a column along the common source pillar (e.g., $SP^{(i)}_n$) and the common drain pillar (e.g., $DP^{(i)}_n$). In the physical layout, according to the fabrication method as applied, the columns or rows may be twisted and arranged in a honeycomb pattern or other patterns for high density or other reasons.

In FIG. 1A, in the block $BLOCK^{(i)}$, the AND memory cells 20 in the $n^{th}$ column of the memory array $A^{(i)}$ share a common source pillar (e.g., $SP^{(i)}_n$ n) and a common drain pillar (e.g., $DP^{(i)}_n$). The AND memory cells 20 in an $(n+1)^{th}$ column share a common source pillar (e.g., $SP^{(i)}_{n+1}$) and a common drain pillar (e.g., $DP^{(i)}_{n+1}$).

The common source pillar (e.g., $SP^{(i)}_n$) is coupled to a common source line (e.g., $SL_n$) and the common drain pillar (e.g., $DP^{(i)}_n$) is coupled to a common bit line (e.g., $BL_n$). The common source pillar (e.g., $SP^{(i)}_{n+1}$) is coupled to a common source line (e.g., $SL_{n+1}$) and the common drain pillar (e.g., $DP^{(i)}_{n+1}$) is coupled to a common bit line (e.g., $BL_{n+1}$).

Likewise, the block $BLOCK^{(i+1)}$ includes a memory array $A^{(i+1)}$ which is similar to the memory array $A^{(i)}$ in the block $BLOCK^{(i)}$. A row (e.g., an $(m+1)^{th}$ row) of the memory array $A^{(i+1)}$ is a set of AND memory cells 20 having a common word line (e.g., $WL^{(i+1)}_{m+1}$). The AND memory cells 20 of the memory array $A^{(i+1)}$ in each row (e.g., the $(m+1)^{th}$ row) correspond to a common word line (e.g., $WL^{(i+1)}_{m+1}$) and are coupled to different source pillars (e.g., $SP^{(i+1)}_n$ and $SP^{(i+1)}_{n+1}$) and drain pillars (e.g., $DP^{(i+1)}_n$ and $DP^{(i+1)}_{n+1}$). A column (e.g., an $n^{th}$ column) of the memory array $A^{(i+1)}$ is a set of AND memory cells 20 having a common source pillar (e.g., $SP^{(i+1)}_n$) and a common drain pillar (e.g., $DP^{(i+1)}_n$). The AND memory cells 20 of the memory array $A^{(i+1)}$ in each column (e.g., the $n^{th}$ column) correspond to different word lines (e.g., $WL^{(i+1)}_{m+1}$ and $WL^{(i+1)}_m$) and are coupled to a common source pillar (e.g., $SP^{(i+1)}_n$) and a common drain pillar (e.g., $DP^{(i+1)}_n$). Hence, the AND memory cells 20 of the memory array $A^{(i+1)}$ are logically arranged in a column along the common source pillar (e.g., $SP^{(i+1)}_n$) and the common drain pillar (e.g., $DP^{(i+1)}_n$).

The block $BLOCK^{(i+1)}$ and the block $BLOCK^{(i)}$ share source lines (e.g., $SL_n$ and $SL_{n+1}$) and bit lines (e.g., $BL_n$ and $BL_{n+1}$). Therefore, the source line $SL_n$ and the bit line $BL_n$ are coupled to the $n^{th}$ column of AND memory cells 20 in the AND memory array $A^{(i)}$ of the block $BLOCK^{(i)}$, and are coupled to the $n^{th}$ column of AND memory cells 20 in the AND memory array $A^{(i+1)}$ of the block $BLOCK^{(i+1)}$. Similarly, the source line $SL_{n+1}$ and the bit line $BL_{n+1}$ are coupled to the $(n+1)^{th}$ column of AND memory cells 20 in the AND memory array $A^{(i)}$ of the block $BLOCK^{(i)}$, and are coupled to the $(n+1)^{th}$ column of AND memory cells 20 in the AND memory array $A^{(i+1)}$ of the block $BLOCK^{(i+1)}$.

Referring to FIG. 1B to FIG. 1D, the memory array 10 may include a plurality of sub-blocks such as a sub-block B1 and a sub-block B2. A slit SLT extends along a direction X and separates gate stack structures 52 of the two adjacent sub-blocks B1 and B2. The slit SLT includes an insulating material. The insulating material may include an organic insulating material, an inorganic insulating material, or a combination thereof. The sub-blocks B1 and B2 may each include a gate stack structure 52, a plurality of channel pillars 116, a plurality of first conductive pillars (also referred to as source pillars) 32a, a plurality of second conductive pillars (also referred to as drain pillars) 32b, and a plurality of charge storage structures 40, which are disposed on a dielectric substrate 50.

Referring to FIG. 1D, the memory array 10 may be disposed over an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a conductive interconnect structure formed on a silicon substrate. The dielectric substrate 50 may include an array region AR and a staircase region SR (as shown in FIG. 1B).

Referring to FIG. 1B and FIG. 1C, the gate stack structure 52 is formed on the dielectric substrate 50 in the array region AR and the staircase region SR. The gate stack structure 52 includes a plurality of gate layers (also referred to as word lines) 38 and a plurality of insulating layer 54 vertically stacked on a surface of the dielectric substrate 50 (as shown in FIG. 1C to FIG. 1E). In a direction Z, the gate layers 38 are electrically isolated from each other by the insulating layer 54 disposed therebetween. The gate layer 38 extends in a direction parallel to the surface of the dielectric substrate 50 (as shown in FIG. 1C to FIG. 1E). As shown in FIG. 1B, the gate layers 38 in the staircase region SR may have a staircase structure. Therefore, a lower gate layer 38 is longer than an upper gate layer 38, and the end of the lower gate layer 38 extends laterally beyond the end of the upper gate layer 38. As shown in FIG. 1B, a contact Cl for connecting the gate layer 38 may land on the end of the gate layer 38 to connect the gate layers 38 respectively to conductive lines.

Referring to FIG. 1B to FIG. 1E, the memory array 10 further includes a plurality of channel pillars 16. The channel pillar 16 continuously extends through the gate stack structure 52 in the array region AR. In some embodiments, the channel pillar 16 may have a ring shape in a top view (as shown in FIG. 1B.). The material of the channel pillar 16 may be semiconductor such as undoped polysilicon. The channel pillar 16 may also be referred to as a vertical channel (VC).

Referring to FIG. 1C to FIG. 1E, the memory array 10 further includes an insulating filling layer 24, an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a and the second conductive pillar 32b are disposed in a pair in the channel pillar 16, and each extend in a direction (i.e., the direction Z) perpendicular to the gate layer 38. The first conductive pillar 32a and the second conductive pillar 32b are separated from each other by the insulating filling layer 24 and the insulating pillar 28. The first conductive pillar 32a and the second conductive pillar 32b are electrically connected to the channel pillar 16. The first conductive pillar 32a and the second conductive pillar 32b include doped polysilicon or metal materials. The insulating pillar 28 is, for example, silicon nitride. The insulating filling layer 24 is, for example, silicon oxide.

Referring to FIG. 1D and FIG. 1E, at least a portion of the charge storage structure 40 is disposed between the channel pillar 16 and the gate layers 38. The charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1D, a portion (the tunneling layer 14 and the charge storage layer 12) of the charge storage structure 40 continuously extends in a direction (i.e., the direction Z) perpendicular to the gate layer 38, and the other portion (the blocking layer 36) of the charge storage structure 40 surrounds the gate layer 38. In other embodiments, as shown in FIG. 1E, the charge storage structure 40 (the tunneling layer 14, the charge storage layer 12, and the blocking layer 36) surrounds the gate layer 38.

Referring to FIG. 1F, the charge storage structure 40, the channel pillar 16, the source pillar 32a, and the drain pillar 32b are surrounded by the gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage ($V_{th}$) of the corresponding memory cell 20 is applied, a channel region of the channel pillar 16 intersecting the selected word line 38 is turned on to allow a current to enter the drain pillar 32b from the bit line $BL_n$ or $BL_{n+1}$ (shown in FIG. 1C), flow to the source pillar 32a via the turned-on channel region (e.g., in a direction indicated by arrow 60), and finally flow to the source line $SL_n$ or $SL_{n+1}$ (shown in FIG. 1C).

Referring to FIG. 1C, the bit line $BL_n$, $BL_{n+1}$ and the source line $SL_n$, $SL_{n+1}$ may be formed by a conductive interconnect located above the memory cell array. The method of forming the bit line $BL_n$, $BL_{n+1}$ and the source line $SL_n$, $SL_{n+1}$ may be shown with reference to FIG. 2A to FIG. 2E and FIG. 3A to FIG. 3E, or with reference to FIG. 4A to FIG. 4C and FIG. 5A to FIG. 5C.

FIG. 2A to FIG. 2E show top views of a process of fabricating a 3D AND flash memory according to some embodiments. FIG. 3A to FIG. 3E are cross-sectional views taken along line of FIG. 2A to FIG. 2E. FIG. 3F shows a partial perspective view of FIG. 3E. The cross-sectional views of the memory array 10 in FIG. 3A to FIG. 3E are similar to FIG. 1E, but they may also be similar to FIG. 1D.

In addition, for clarity, neither of dielectric layers 62 and 68 is shown in FIG. 2A to FIG. 2E and FIG. 3F.

Figure 2A:
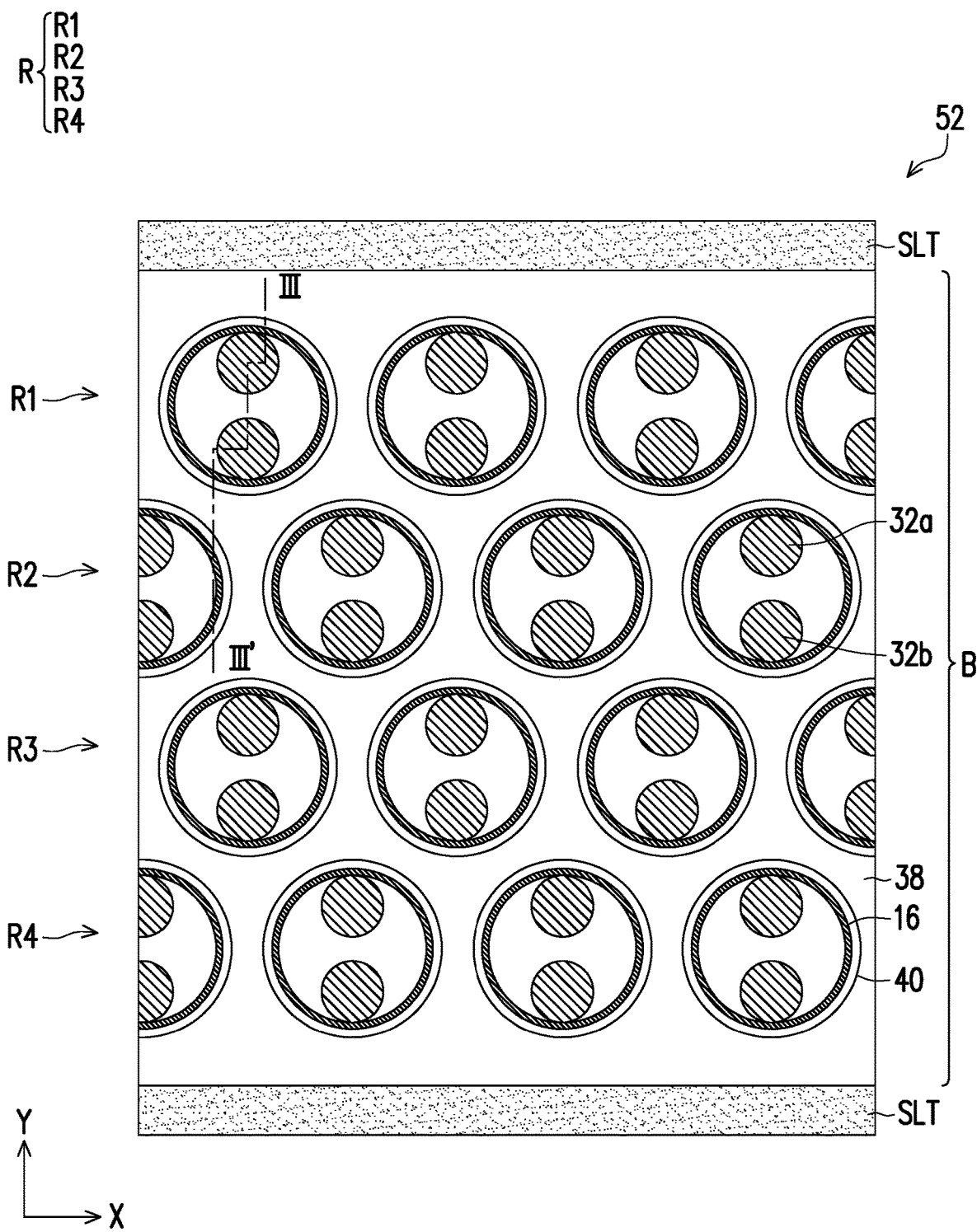
FIG. 2A to FIG. 2E show top views of a process of fabricating a 3D AND flash memory according to some embodiments.
Figure 2B:
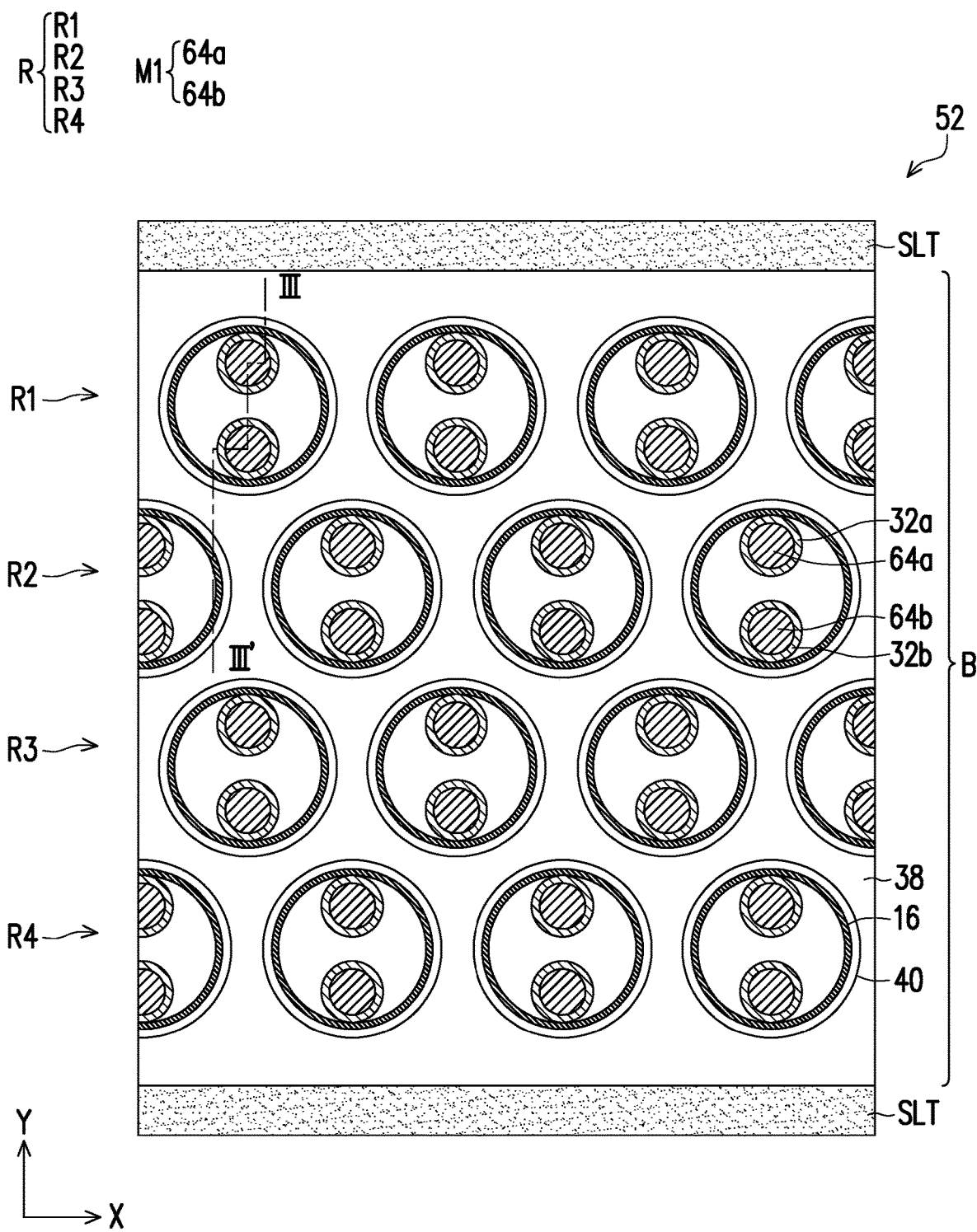
Figure 2C:
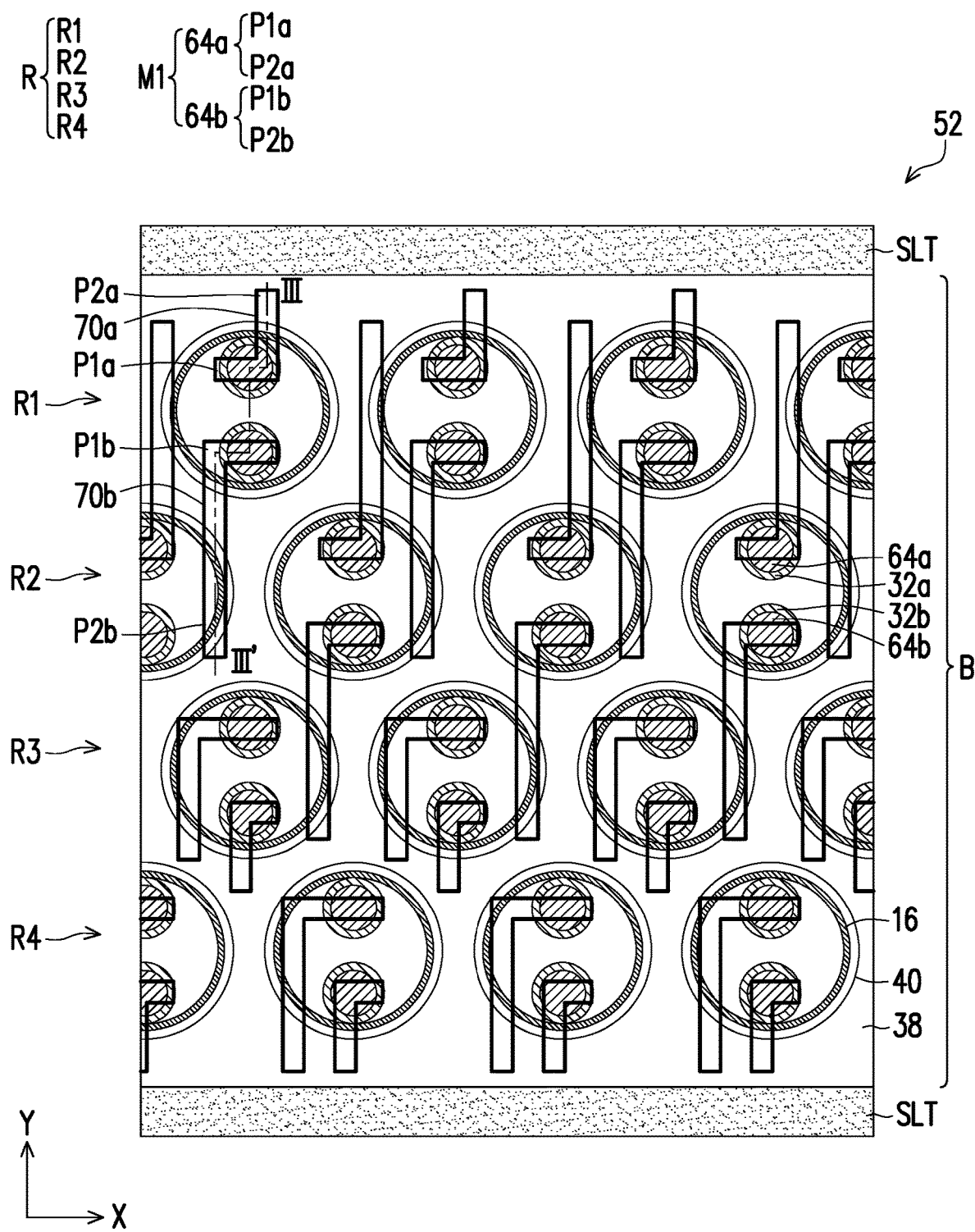
Figure 2D:
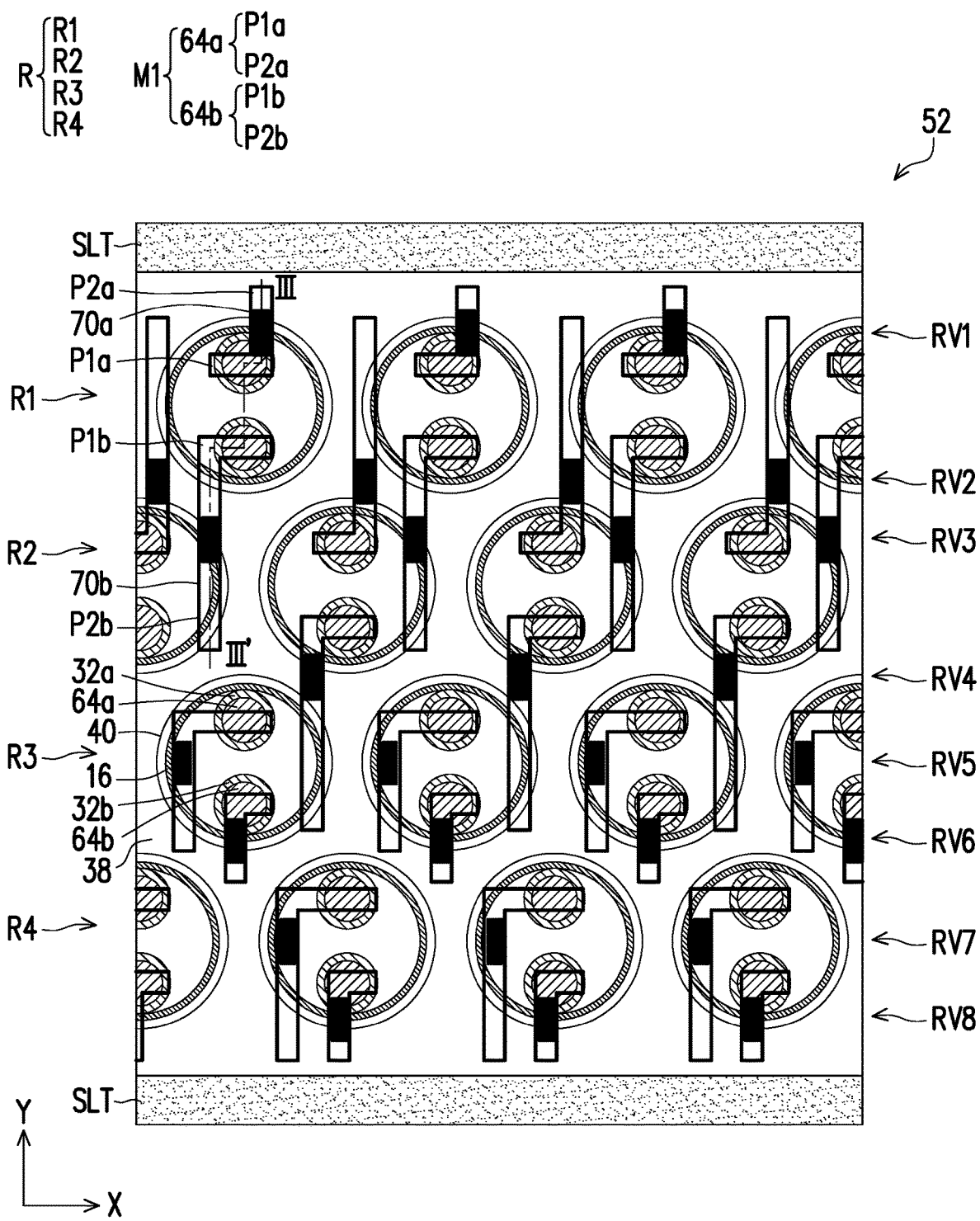
Figure 2E:
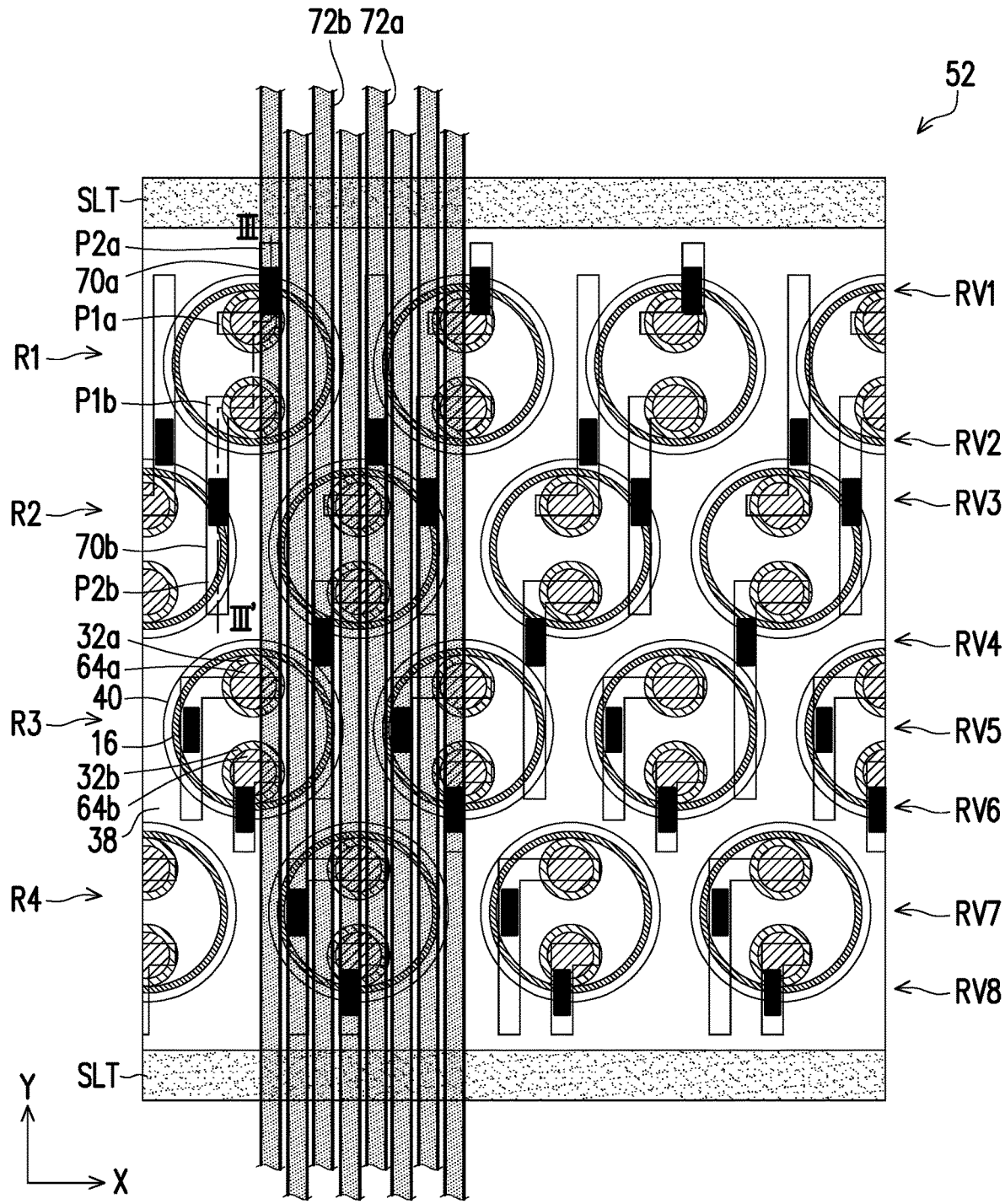
Figure 3A:
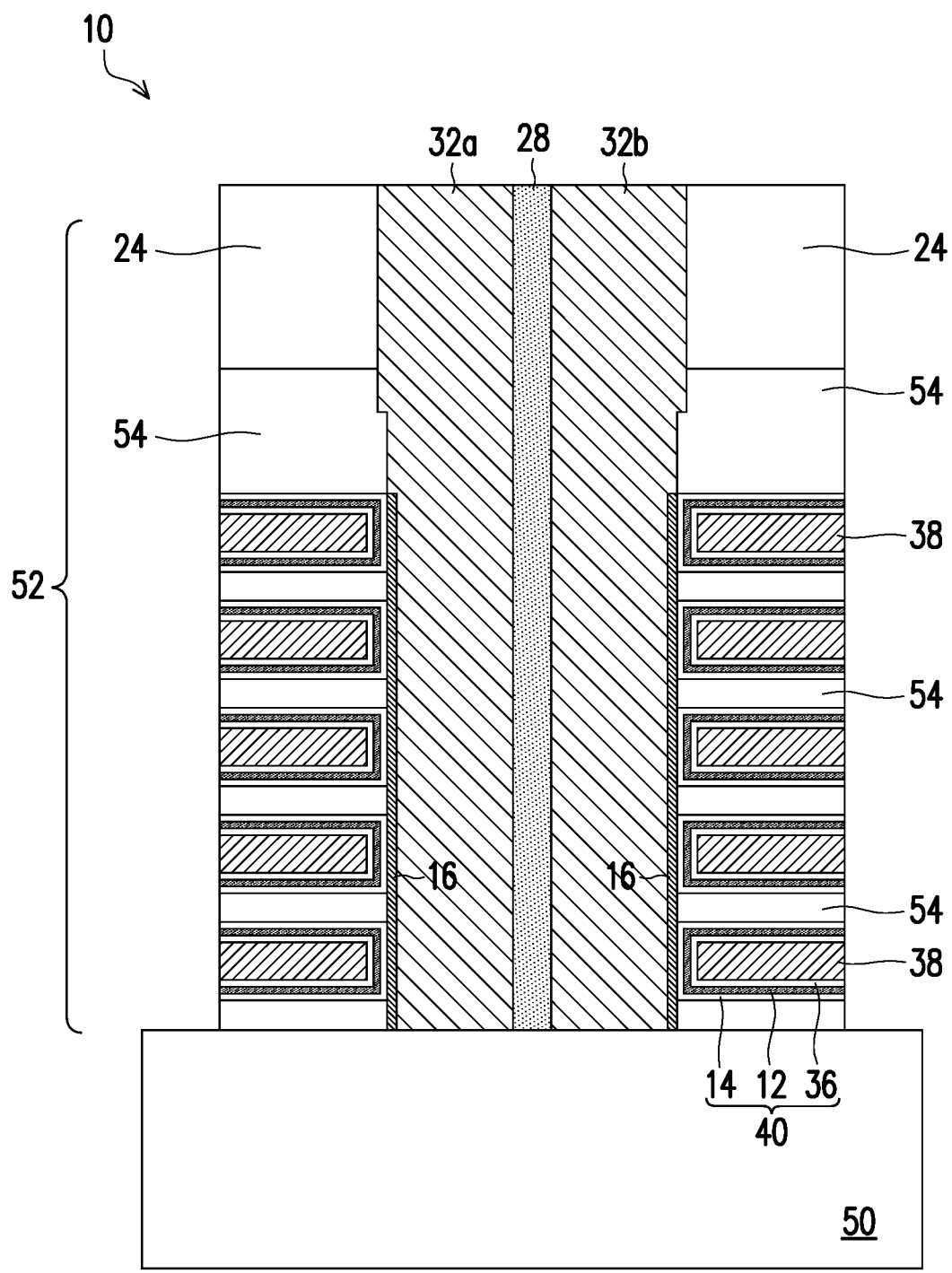
FIG. 3A to FIG. 3E show cross-sectional views along line III-III' of FIG. 2A to FIG. 2E.
Figure 3B:
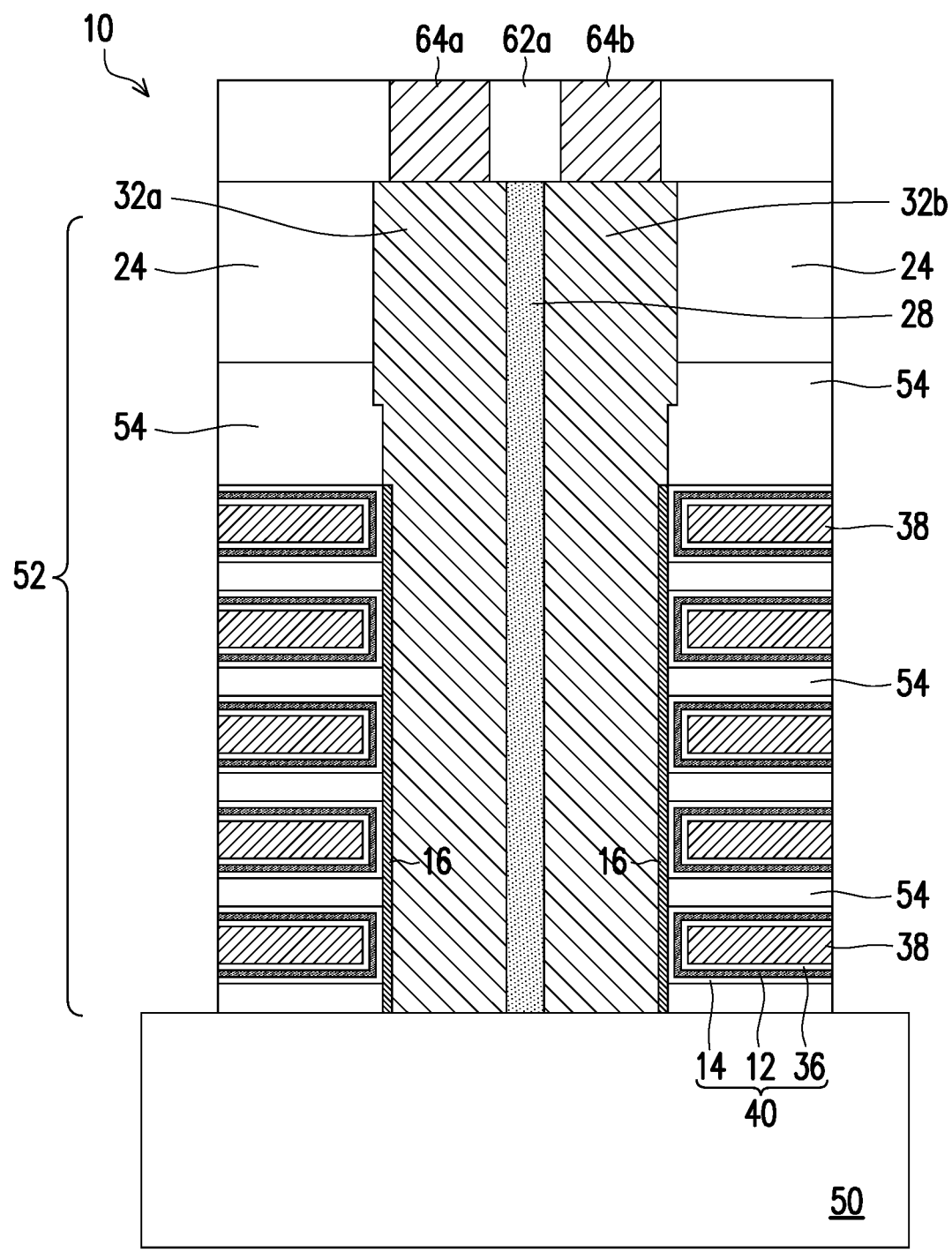
Figure 3C:
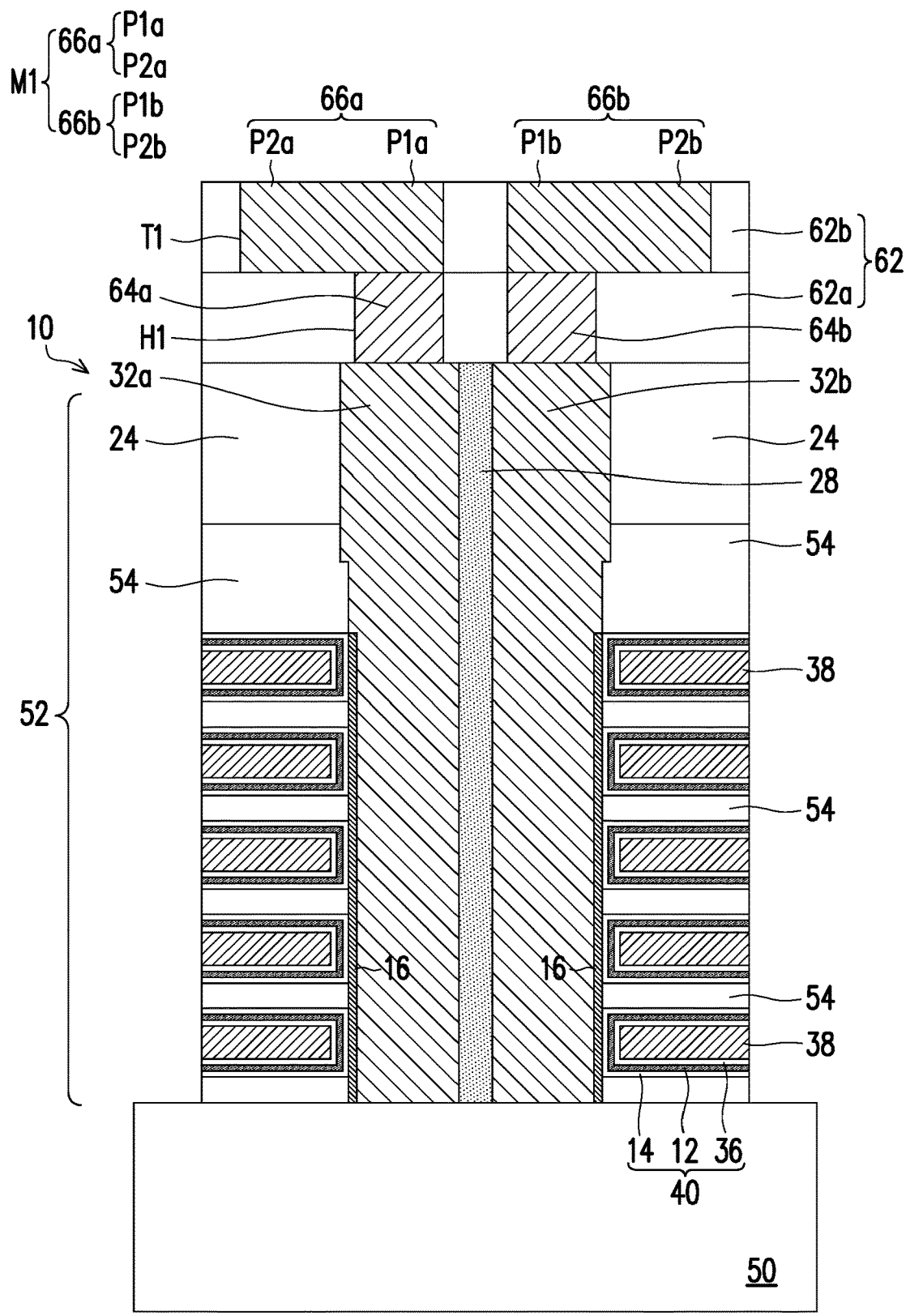
Figure 3D:
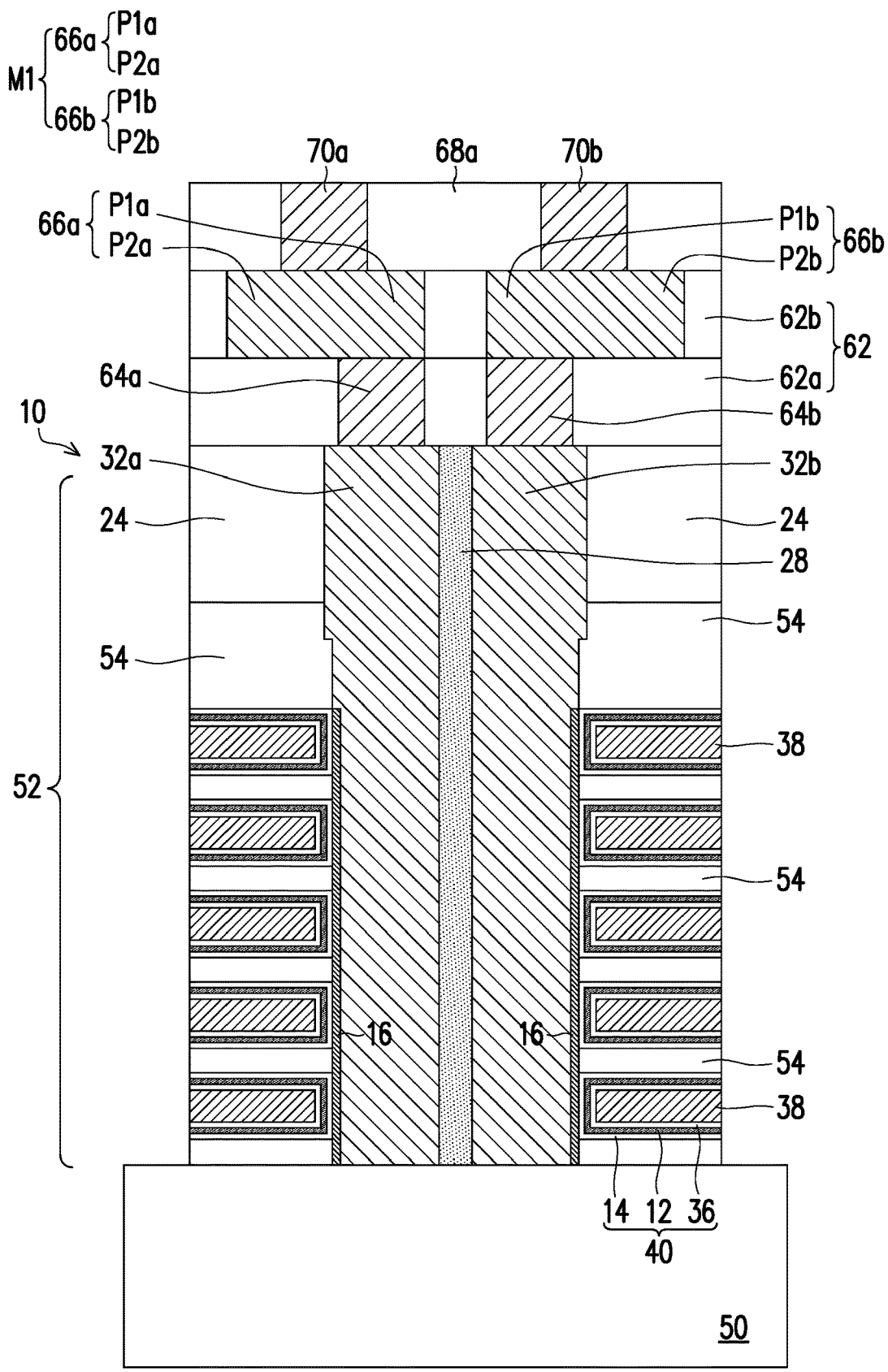
Figure 3E:
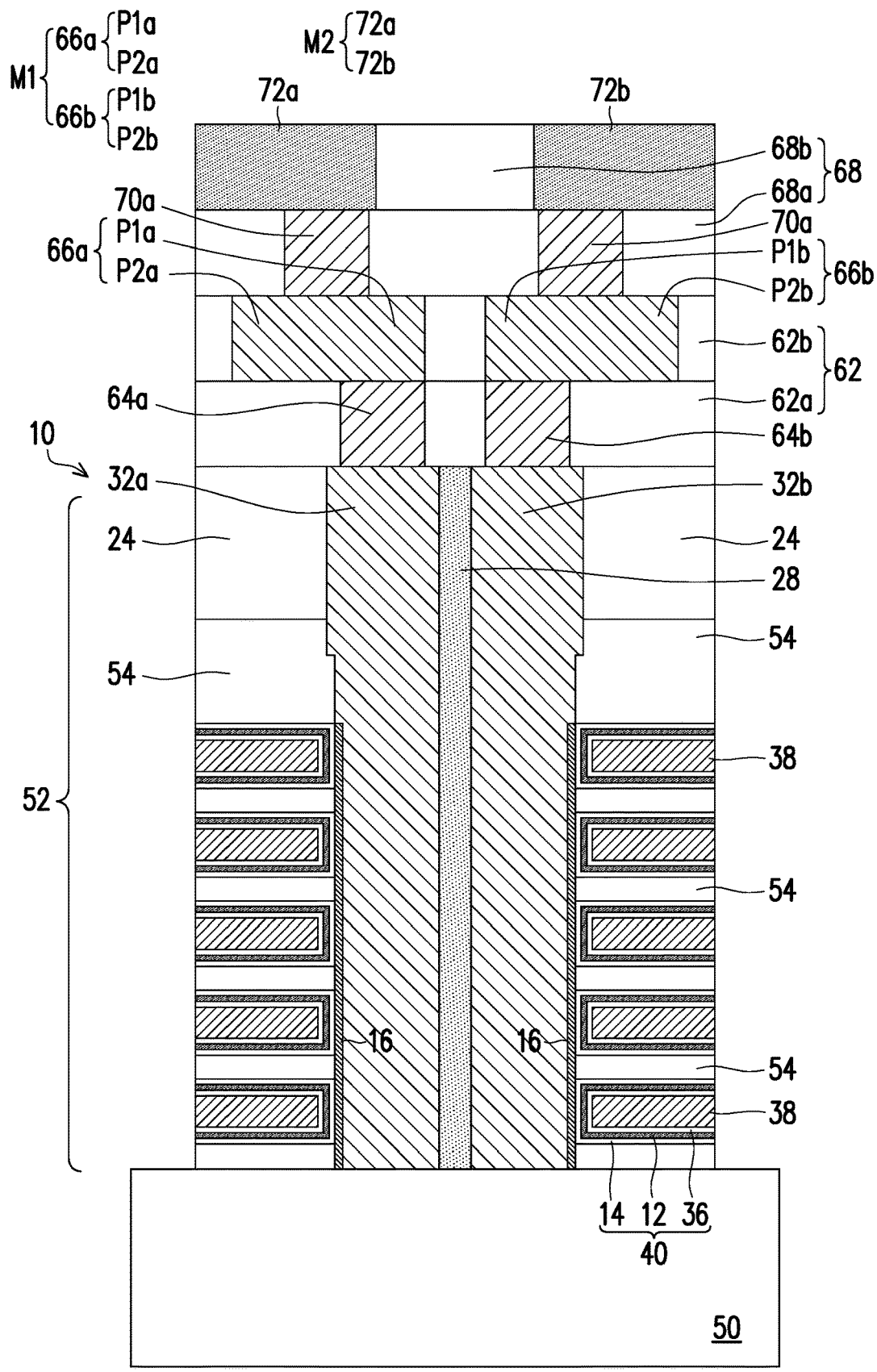
Figure 3F:
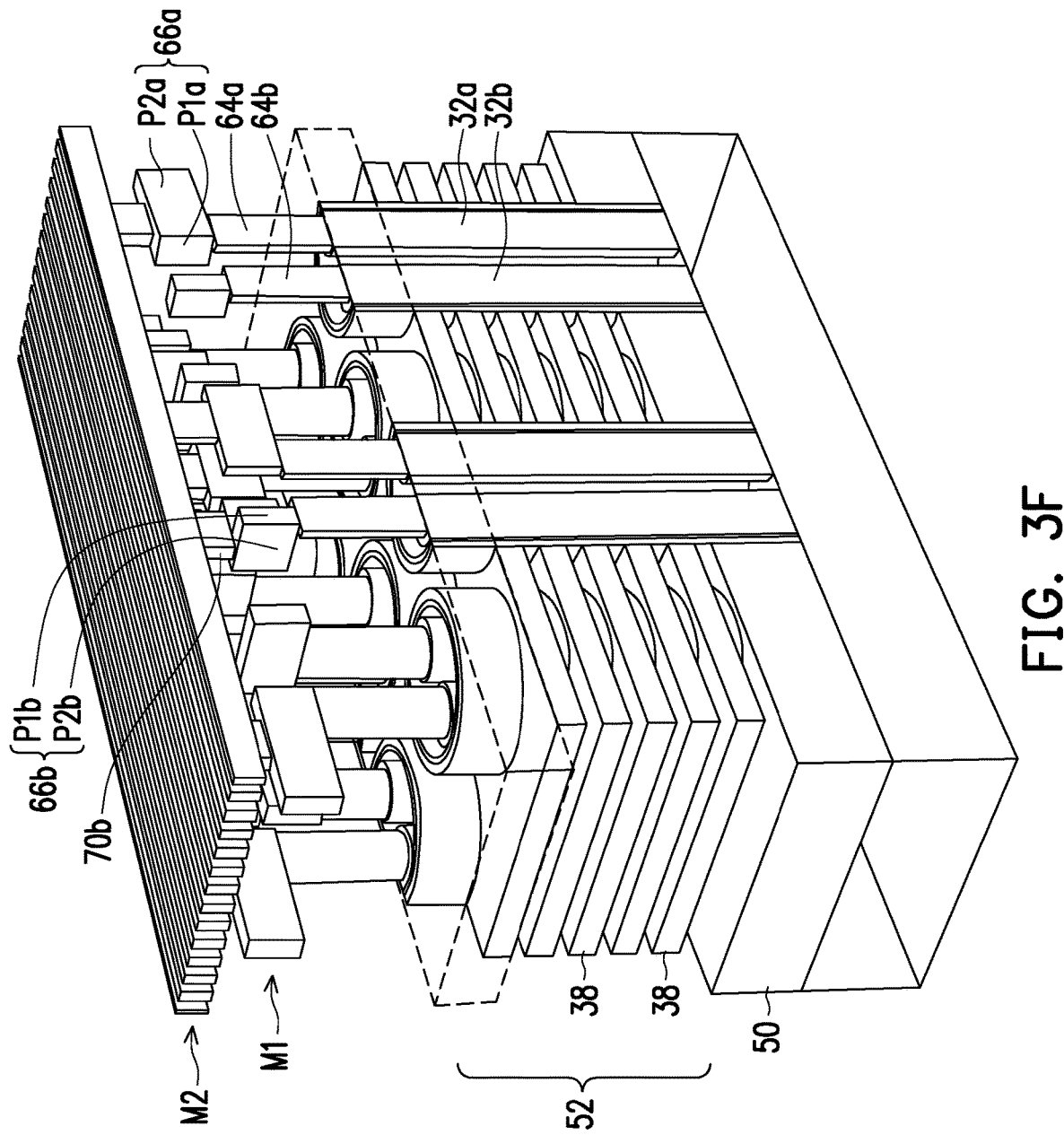
FIG. 3F shows a perspective view of FIG. 3E.

Referring to FIG. 2A, FIG. 3A, and FIG. 3F, a gate stack structure 52 is divided into a plurality of sub-blocks B by a slit SLT. For simplicity, only one sub-block B is shown in the figures. The sub-block B includes a plurality of rows R, e.g., R1, R2, R3, and R4. Although only four rows are shown in the sub-block B in FIG. 2A to FIG. 2E, but is not limited thereto, each sub-block B may include more rows.

The channel pillars 16 of each row R are arranged along the direction X. The channel pillars 16 of two adjacent rows, e.g., rows R1 and R2, are staggered with each other. The channel pillars 16 of odd-numbered rows, e.g., rows R1 and R3, are arranged along a direction Y. The channel pillars 16 of even-numbered rows, e.g., rows R2 and R4, are arranged along the direction Y. The direction Y and the direction X are perpendicular to each other.

A pair of conductive pillars (i.e., the first conductive pillar 32a and the second conductive pillar 32b) in each channel pillar 16 are arranged along the direction Y and are separated from each other by the insulating pillar 28 (not shown in FIG. 2A for simplicity of the figure). The plurality of first conductive pillars 32a and the plurality of second conductive pillars 32b of each row R are respectively arranged along the direction X. The plurality of first conductive pillars 32a and the plurality of second conductive pillars 32b of the odd-numbered rows, e.g., the rows R1 and R3, are arranged along the direction Y. The plurality of first conductive pillars 32a and the plurality of second conductive pillars 32b of the even-numbered rows, e.g., the rows R2 and R4, are arranged along the direction Y.

Referring to FIG. 2B, FIG. 3B, and FIG. 3F, a dielectric layer 62a is covered on the gate stack structure 52. Plugs 64a and 64b are buried in the dielectric layer 62a. The plugs 64a and 64b respectively land on the first conductive pillar 32a and the second conductive pillar 32b and are electrically connected thereto. The sizes of the plugs 64a and 64b may be smaller than or equal to the sizes of the first conductive pillar 32a and the second conductive pillar 32b.

Referring to FIG. 2C, FIG. 3C, and FIG. 3F, a dielectric layer 62b is covered on the dielectric layer 62a. The dielectric layer 62b has a first conductive layer M1. The first conductive layer M1 refers to a first conductive layer of the conductive interconnect above the memory array 10. The first conductive layer M1 includes a plurality of conductive lines 66a and 66b. The conductive lines 66a and 66b are respectively electrically connected to the plugs 64a and 64b. The conductive line 66a includes a first part P1a and a second part P2a; the conductive line 66b includes a first part P1b and a second part P2b. The first part P1a and the second part P2a, or the first part P1b and the second part P2b, may be respectively combined into an L-shaped pattern, a T-shaped pattern, a cross-shaped pattern, or a similar pattern. In some embodiments, the conductive lines 66a and 66b have the same pattern to simplify the complexity of the fabrication process. In the following, an L-shape conductive line 66a will be described as an example. The first part P1a extends along the direction X and is connected to the plug 64a. The length of the first part P1a in the direction X may be less than, equal to, or greater than the diameter of the first conductive pillar 32a. The second part P2a is connected to one end of the first part P1a and extends along the direction Y to be covered above the channel pillar 16 or above the charge storage structure 40, or the second part P2a may even extend to be covered above the gate layer 38 outside the charge storage structure 40.

The first parts P1a and P1b electrically connected to the first conductive pillar 32a and the second conductive pillar 32b in the same channel pillar 16 are opposite to each other; the second parts P2a and P2b are away from each other and not overlapped in the direction X (e.g., in the rows R1 and R2), or adjacent to each other and overlapped in the direction X (e.g., in the rows R3 and R4). In the same row R, the plurality of first parts P1a or P1b may be respectively arranged along the direction X. In the same row R, the plurality of second parts P2a or P2b may be respectively arranged along the direction X. In adjacent rows R, e.g., the rows R1 and R2, the plurality of second parts P2a and/or P2b may be staggered with each other.

The plugs 64a and 64b and the conductive lines 66a and 66b are, for example, metal filling layers such as tungsten or copper. In some embodiments, the plugs 64a and 64b further include a barrier layer located between the metal filling layer and the dielectric layers 62a and 62b. The barrier layer is, for example, titanium, titanium nitride, tantalum, tantalum nitride, or a combination thereof. The plugs 64a and 64b and the conductive lines 66a and 66b may be formed by a single damascene or dual damascene process, but are not limited thereto. A dual damascene process will be described below as an example.

Referring to FIG. 3C, a dielectric layer 62 is formed on the gate stack structure 52. The dielectric layer 62 includes dielectric layers 62a and 62b. The dielectric layers 62a and 62b may have an interface or have no interface therebetween. The dielectric layer 62 is, for example, silicon oxide. A plurality of trenches T1 and a plurality of plug holes H1 are formed in the dielectric layer 62 through photolithography and etching processes. Next, a barrier layer and a metal filling layer are refilled. Then, the excessive barrier layer and metal filling layer on the dielectric layer 62 are removed through an etch-back process or a chemical-mechanical polishing process to form the plugs 64a and 64b and the conductive lines 66a and 66b.

Referring to FIG. 2D, FIG. 3D, and FIG. 3F, a dielectric layer 68a is covered on the dielectric layer 62 and the conductive lines 66a and 66b. Vias 70a and 70b are buried in the dielectric layer 68a. The vias 70a and 70b respectively land on the conductive lines 66a and 66b. More specifically, the via 70a lands on the second part P2a of the conductive line 66a and is electrically connected thereto; the via 70b lands on the second part P2b of the conductive line 66b and is electrically connected thereto. The vias 70a and 70b may be covered above the channel pillar 16 or above the charge storage structure 40, or may even extend to be covered above the gate layer 38. In the same row R, the vias 70a and 70b may be respectively arranged along the direction X. In adjacent rows R, the via 70a and the via 70a may be staggered with each other, or the via 70a and the via 70b may be staggered with each other. In this embodiment, the vias 70a of the row R1, the vias 70b of the row R1, the vias 70a of the row R2, the vias 70b of the row R2, the vias 70a of the row R3, the vias 70b of the row R3, the vias 70a of the row R4, and the vias 70b of the row R4 are arranged into via rows RV1, RV2, RV3, RV4, RV5, RV6, RV7, and RV8.

Referring to FIG. 2E, FIG. 3E, and FIG. 3F, a dielectric layer 68b is covered on the dielectric layer 68a. The dielectric layer 68b has a second conductive layer M2. The second conductive layer M2 refers to a second conductive layer of the conductive interconnect above the memory array 10. The second conductive layer M2 includes a plurality of conductive lines 72a and 72b. The conductive lines 72a and 72b respectively extend along the direction Y and are arranged along the direction X. The conductive lines 72a and 72b are respectively electrically connected to the vias 70a and 70b. In the direction Z, the conductive lines 72a and 72b respectively overlap with the second parts P2a and P2b of the conductive lines 66a and 66b. The conductive lines 72a and 72b that are electrically connected to the first conductive pillar 32a and the second conductive pillar 32b in the same channel pillar 16 are not adjacent to each other. The conductive lines 72a and 72b that are adjacent to each other are connected to two conductive pillars (the first conductive pillar 32a and the second conductive pillar 32b) in different rows. In some embodiments, each channel pillar 16 is crossed over by at least two, for example six, conductive lines 72a and 72b.

The vias 70a and 70b and the conductive lines 72a and 72b are, for example, metal filling layers such as tungsten or copper. In some embodiments, the vias 70a and 70b further include a barrier layer located between the metal filling layer and the dielectric layers 68a and 68b. The barrier layer is, for example, titanium, titanium nitride, tantalum, tantalum nitride, or a combination thereof. The vias 70a and 70b and the conductive lines 72a and 72b may be formed by a single damascene or dual damascene process, but are not limited thereto. A dual damascene process will be described below as an example.

Referring to FIG. 3E, first, a dielectric layer 68 is formed on the dielectric layer 62 and the first conductive layer M1. The dielectric layer 68 includes dielectric layers 68a and 68b. The dielectric layers 68a and 68b may have an interface or have no interface therebetween. The dielectric layer 68 is, for example, silicon oxide. In some embodiments, a plurality of trenches and a plurality of plug holes are formed in the dielectric layer 68 through a patterning process such as photolithography and etching processes. In other embodiments, a plurality of trenches and a plurality of plug holes may be formed through a self-aligned double patterning (SADP) process. Next, a barrier layer and a metal filling layer are refilled. Then, the excessive barrier layer and metal filling layer on the dielectric layer 68 are removed through an etch-back process or a chemical-mechanical polishing process to form the vias 70a and 70b and the conductive lines 72a and 72b.

Referring to FIG. 3F, the conductive lines 72a and 72b of the second conductive layer M2 may respectively serve as a source line and a bit line. In this embodiment, the pitch between the conductive lines of the second conductive layer M2 is small, so the occupied chip area may be reduced.

In the above embodiments, the first conductive pillars 32a and the second conductive pillars 32b are arranged along the direction Y perpendicular to the extending direction (i.e., the direction X) of the slit SLT. However, the arrangement direction of the first conductive pillars 32a and the second conductive pillars 32b is not limited thereto. In other embodiments, the first conductive pillars 32a and the second conductive pillars 32b are arranged along a direction that forms an acute angle with the extending direction (i.e., the direction X) of the slit SLT, as shown in FIG. 4A to FIG. 4C and FIG. 5A to FIG. 5C.

Figure 4A:
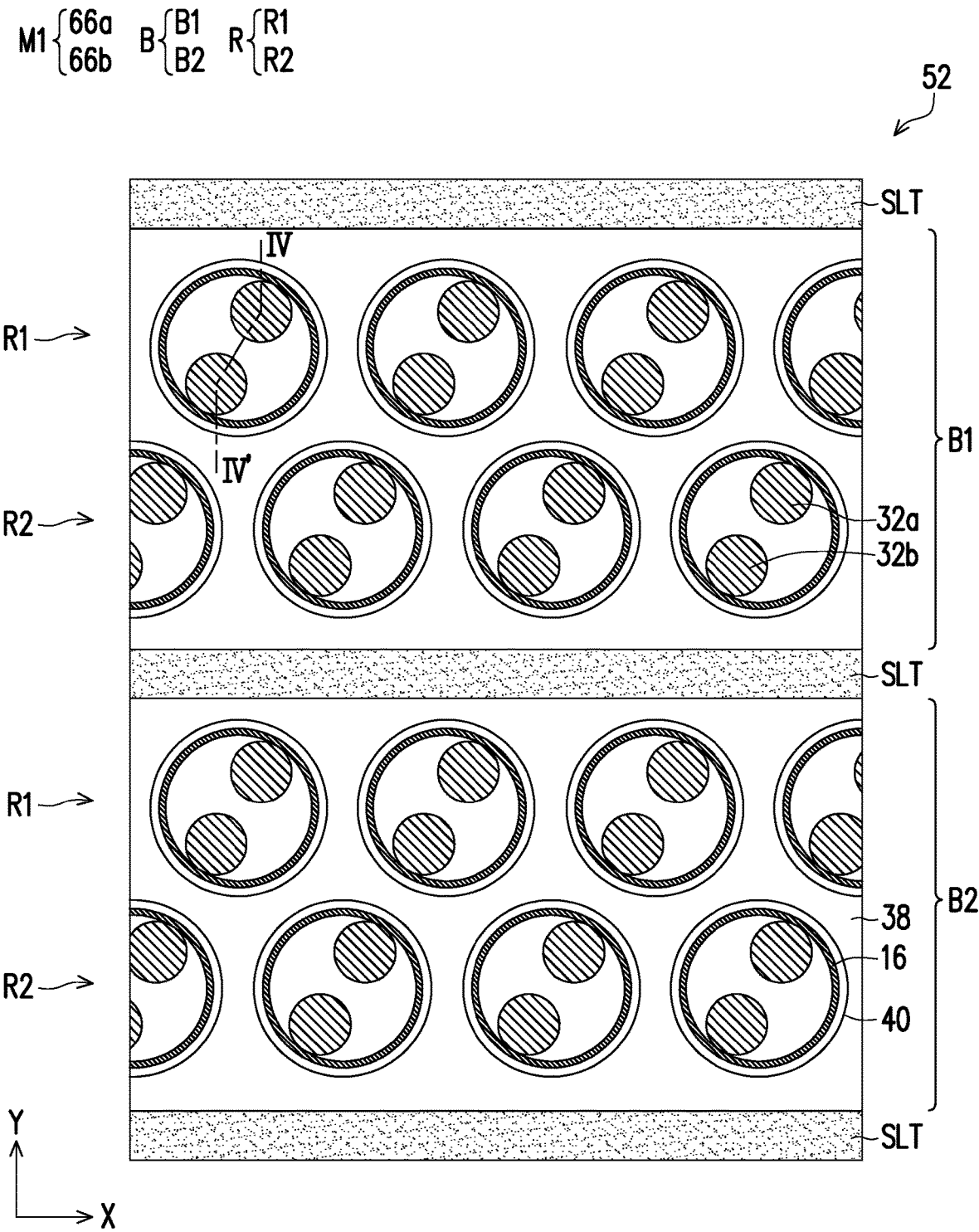
FIG. 4A to FIG. 4C show top views of a process of fabricating a 3D AND flash memory according to other embodiments.
Figure 4B:
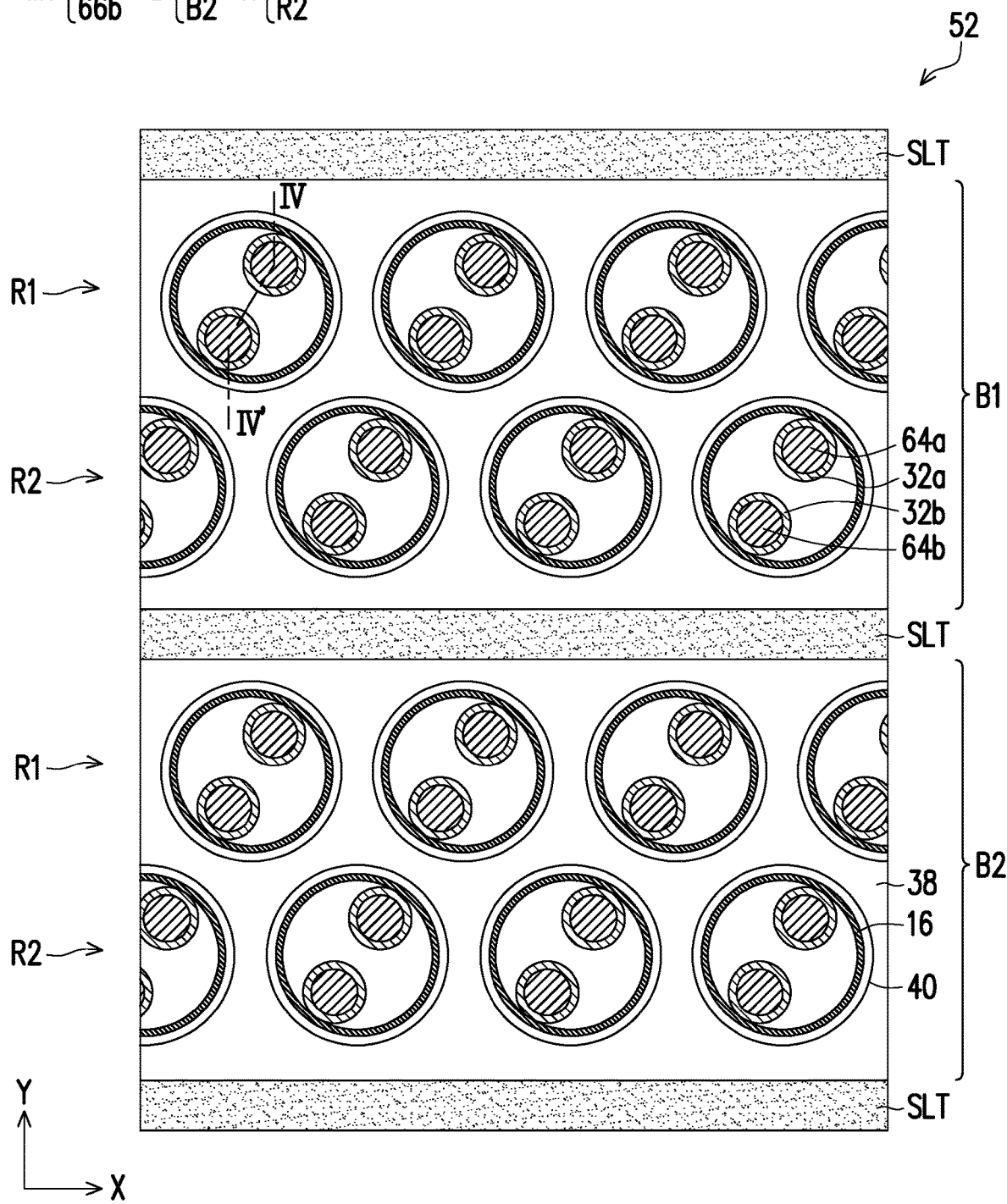
Figure 4C:
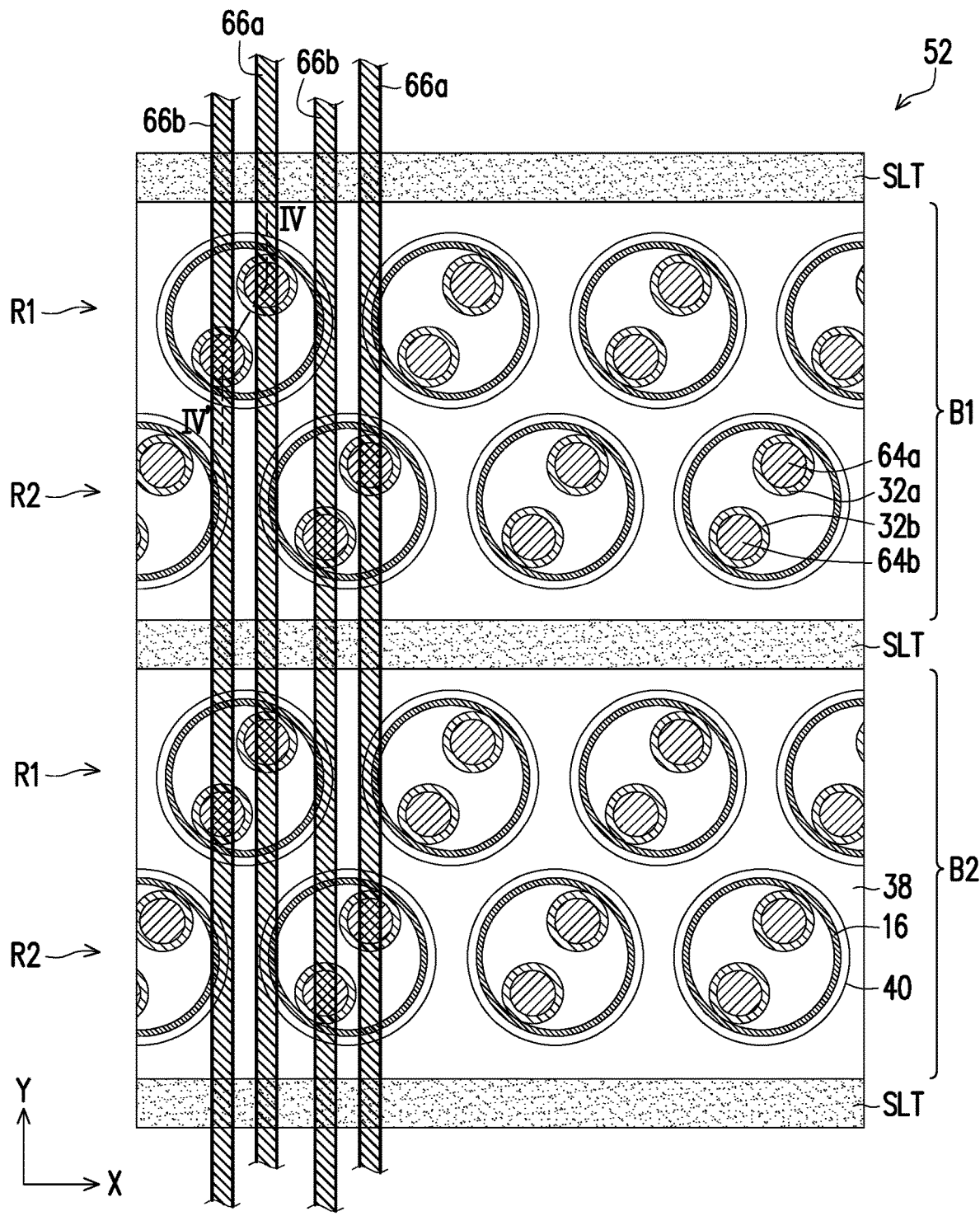
Figure 5A:
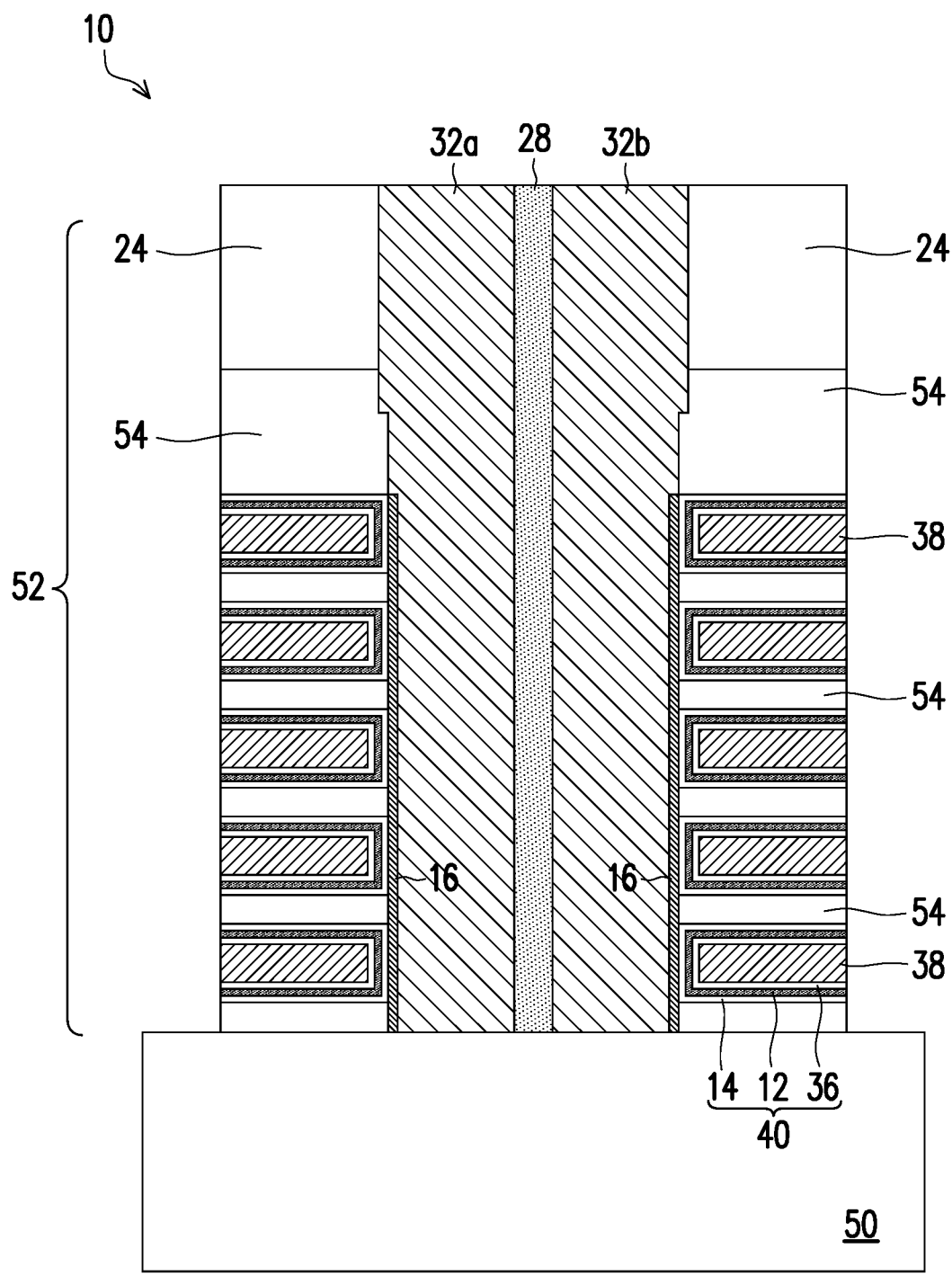
FIG. 5A to FIG. 5C show cross-sectional views along line IV-IV' of FIG. 4A to FIG. 4C.
Figure 5B:
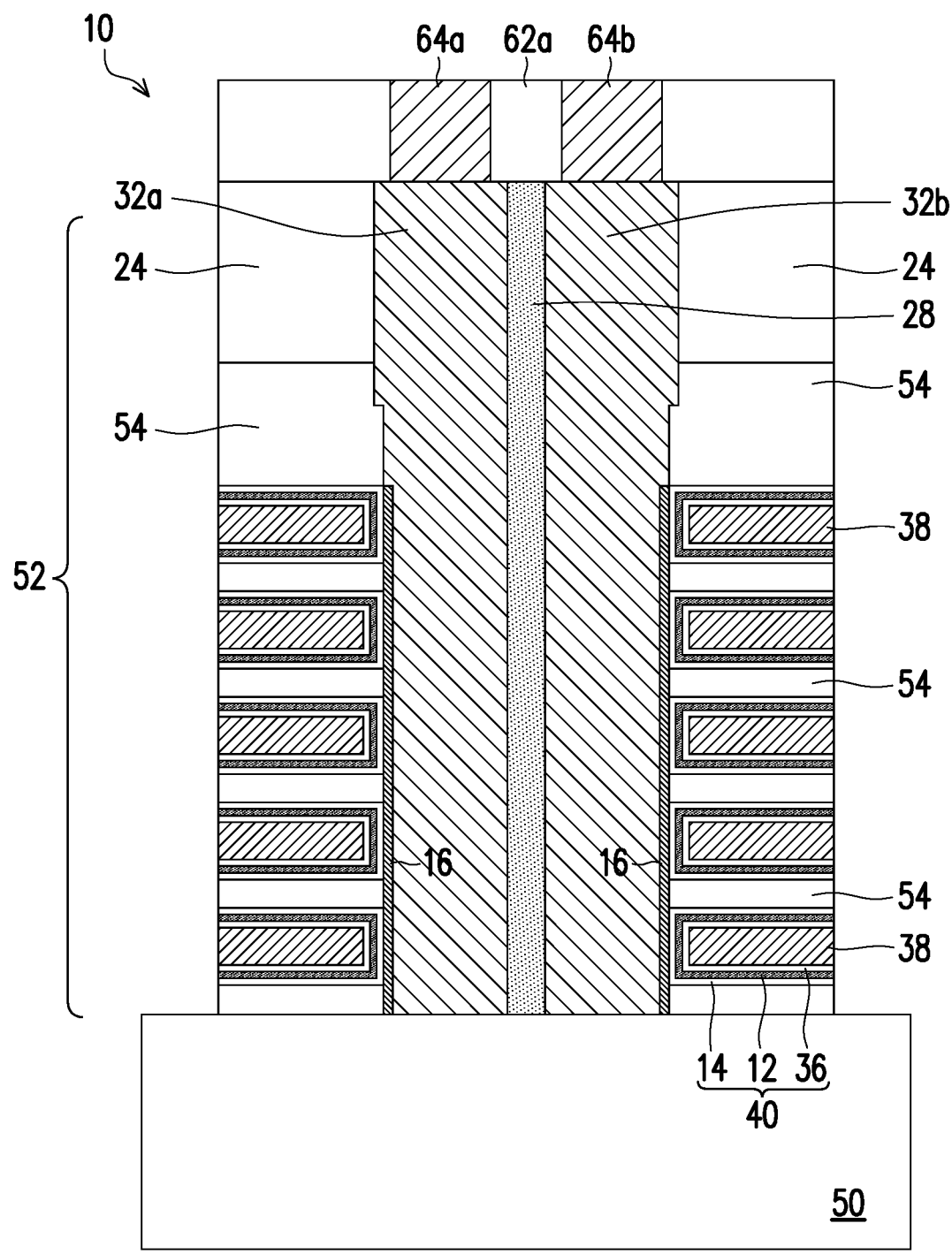
Figure 5C:
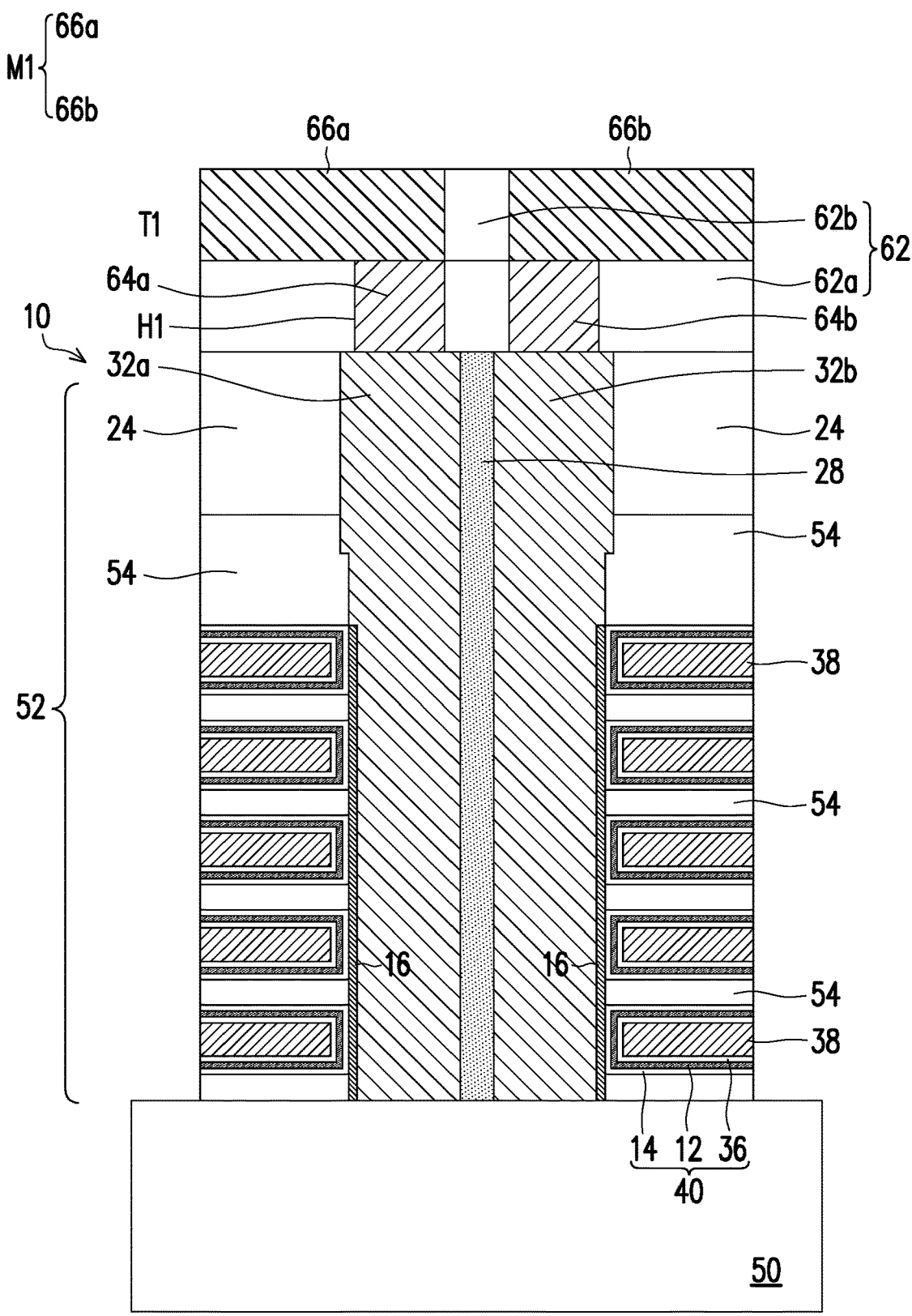

FIG. 4A to FIG. 4C show top views of a process of fabricating a 3D AND flash memory according to some embodiments. FIG. 5A to FIG. 5C are cross-sectional views taken along line IV-IV' of FIG. 4A to FIG. 4C. The cross-sectional views of the memory array 10 in FIG. 5A to FIG. 5C are similar to FIG. 1E, but they may also be similar to FIG. 1D. In addition, for clarity, the dielectric layer 62 is not shown in FIG. 4A to FIG. 4C.

Referring to FIG. 4A and FIG. 5A, the gate stack structure 52 is divided into a plurality of sub-blocks B by a slit SLT.

For simplicity, only sub-blocks B1 and B2 are shown in the figures. Each sub-block B includes a plurality of rows R, e.g., R1 and R2. Although only two rows are shown in each sub-block B in FIG. 4A to FIG. 4C, but is not limited thereto, each sub-block B may include more rows.

The channel pillars 16 of each row R are arranged along the direction X. The channel pillars 16 of two adjacent rows, e.g., rows R1 and R2, are staggered with each other. The channel pillars 16 of the odd-numbered rows, e.g., the row R1, of the sub-blocks B1 and B2 are arranged along the direction Y. The channel pillars 16 of the even-numbered rows, e.g., the row R2, of the sub-blocks B1 and B2 are arranged along the direction Y. The direction Y and the direction X are perpendicular to each other.

The first conductive pillars 32a and the second conductive pillars 32b of each row R are respectively arranged along the direction X. A pair of conductive pillars (i.e., the first conductive pillar 32a and the second conductive pillar 32b) in each channel pillar 16 are arranged along a direction S and are separated from each other by an insulating pillar 28 (not shown FIG. 4A). An included angle θ between the direction S and the extending direction (i.e., the direction X) of the slit SLT is an acute angle. The included angle θ is 55 degrees, for example.

In the same sub-block B, the first conductive pillars 32a of the row R1 and the second conductive pillars 32b of the adjacent row R2 are staggered with each other in the direction Y.

Referring to FIG. 4B and FIG. 5B, a dielectric layer 62a is covered on the gate stack structure 52. Plugs 64a and 64b are buried in the dielectric layer 62a. The plugs 64a and 64b respectively land on the first conductive pillar 32a and the second conductive pillar 32b and are electrically connected thereto. The sizes of the plugs 64a and 64b may be smaller than or equal to the sizes of the first conductive pillar 32a and the second conductive pillar 32b.

Referring to FIG. 4C and FIG. 5C, a dielectric layer 62b is covered on the dielectric layer 62a. The dielectric layer 62b has a first conductive layer M1. The first conductive layer M1 includes a plurality of conductive lines 66a and 66b. The conductive lines 66a and 66b are respectively electrically connected to the plugs 64a and 64b.

The first conductive layer M1 includes the plurality of conductive lines 66a and 66b. The conductive lines 66a and 66b respectively extend along the direction Y, and are arranged along the direction X and alternate with each other. The conductive lines 66a and 66b are respectively electrically connected to the plugs 64a and 64b. The conductive lines 66a and 66b that are electrically connected to the first conductive pillar 32a and the second conductive pillar 32b in the same channel pillar 16 are adjacent to each other. In some embodiments, each channel pillar 16 is crossed over by at least two conductive lines 66a and at least two conductive lines 66b.

The conductive lines 66a electrically connected to the first conductive pillars 32a of the row R1 of the sub-block B1 extend in the direction Y and are electrically connected to the first conductive pillars 32a of the row R1 of the sub-block B2. The conductive lines 66b electrically connected to the second conductive pillars 32b of the row R1 of the sub-block B1 extend in the direction Y and are electrically connected to the second conductive pillars 32b of the row R1 of the sub-block B2. The conductive lines 66a electrically connected to the first conductive pillars 32a of the row R2 of the sub-block B1 extend in the direction Y and are electrically connected to the first conductive pillars 32a of the row R2 of the sub-block B2. The conductive lines 66b electrically connected to the second conductive pillars 32b of the row R2 of the sub-block B1 extend in the direction Y and are electrically connected to the second conductive pillars 32b of the row R2 of the sub-block B2.

The plugs 64a and 64b and the conductive lines 66a and 66b are, for example, metal filling layers such as tungsten or copper. In some embodiments, the plugs 64a and 64b further include a barrier layer located between the metal filling layer and the dielectric layers 62a and 62b. The barrier layer is, for example, titanium, titanium nitride, tantalum, tantalum nitride, or a combination thereof. The plugs 64a and 64b and the conductive lines 66a and 66b may be formed by a single damascene or dual damascene process, but are not limited thereto. A dual damascene process will be described below as an example.

Referring to FIG. 5C, a dielectric layer 62 is formed on the gate stack structure 52. The dielectric layer 62 includes dielectric layers 62a and 62b. The dielectric layers 62a and 62b may have an interface or have no interface therebetween. The dielectric layer 62 is, for example, silicon oxide. A plurality of trenches T2 and a plurality of plug holes H2 are formed in the dielectric layer 62 through photolithography and etching processes. Next, a barrier layer and a metal filling layer are refilled. Then, the excessive barrier layer and metal filling layer on the dielectric layer 62 are removed through an etch-back process or a chemical-mechanical polishing process to form the plugs 64a and 64b and the conductive lines 66a and 66b. The conductive lines 66a and 66b of the first conductive layer M1 may respectively serve as a source line and a bit line.

Figure 4D:
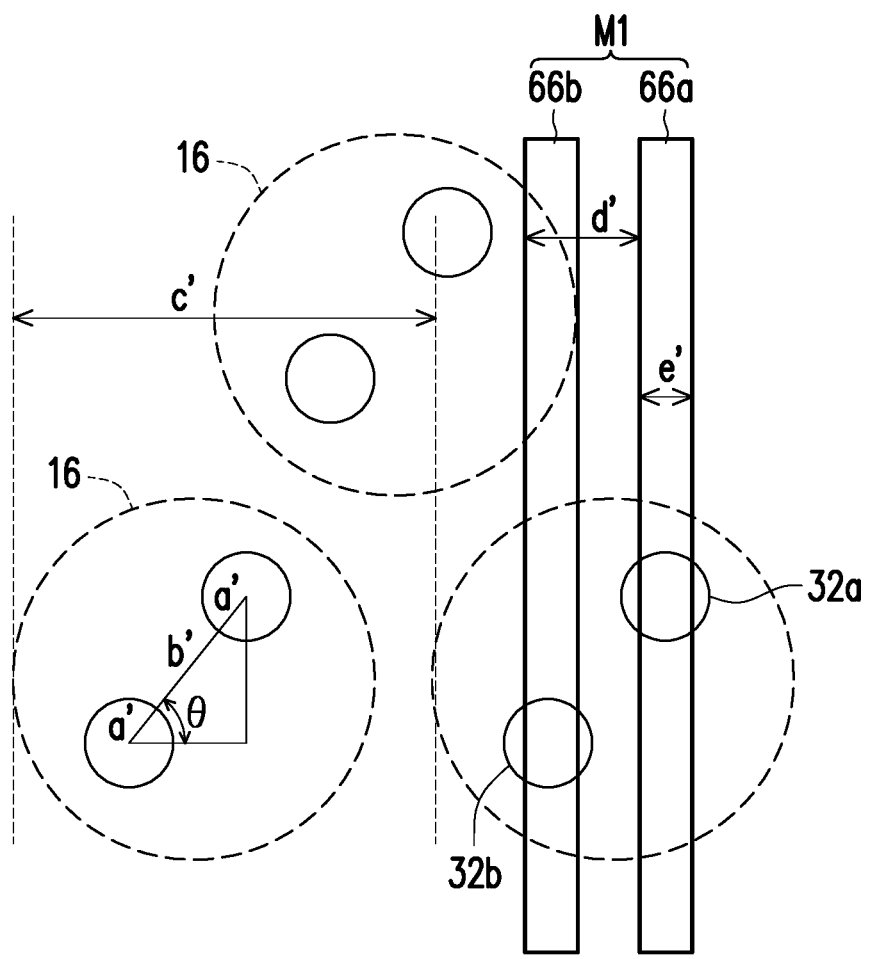
FIG. 4D shows a partial schematic view of FIG. 4C.

Referring to FIG. 4D, in some embodiments, radii of the first conductive pillar 32a and the second conductive pillar 32b are respectively a'. A distance between the first conductive pillar 32a and the second conductive pillar 32b is b'. A distance between the centers of the first conductive pillar 32a and the second conductive pillar 32b is 2a'+b'. A distance between the channel pillars 16 is c'. A pitch d between the conductive line 66a and the conductive line 66b of the first conductive layer M1 is $(2a'+b')\cos\theta$. The pitch d between the conductive line 66a and the conductive line 66b of the first conductive layer M1 may be equal to ¼c'. A width e of the conductive line 66a or the conductive line 66b of the first conductive layer M1 may be equal to ⅛c'.

Referring to FIG. 4C, in this embodiment, the conductive lines 66a and 66b of the first conductive layer M1 above the memory array may serve as a source line and a bit line. Therefore, the wiring complexity may be reduced.

Based on the above, in the embodiment of the disclosure, source lines and bit lines may be formed through a multi-layer conductive interconnect. Therefore, the occupied chip area may be reduced. According to another embodiment of the disclosure, with the source pillars and the drain pillars arranged to form an acute angle with the slit, the wiring complexity may be reduced.

What is claimed is:

1. A three-dimensional AND flash memory device comprising:
   a gate stack structure disposed on a dielectric substrate and comprising a plurality of gate layers and a plurality of insulating layers alternately stacked with each other; and
   a slit extending along a first direction and dividing the gate stack structure into a plurality of sub-blocks, wherein each of the sub-blocks comprises:
   a plurality of rows, each of the rows comprising:
   a plurality of channel pillars disposed on the dielectric substrate and penetrating the gate stack structure;

a plurality of charge storage structures disposed between the gate layers and sidewalls of the channel pillars; and a plurality of pairs of conductive pillars disposed in the plurality of channel pillars, penetrating the gate stack structure, and respectively connected to the channel pillars, wherein each of the pairs of conductive pillars comprises a first conductive pillar and a second conductive pillar, and the first conductive pillar and the second conductive pillar are separated from each other along a second direction, wherein an included angle between the second direction and the first direction is an acute angle, wherein outer sidewalls of the first conductive pillar and the second conductive pillar are in contact with an inner sidewall of a corresponding channel pillar, and top surfaces of the first conductive pillar and the second conductive pillar are higher than a top surface of the corresponding channel pillar.

2. The three-dimensional AND flash memory device according to claim 1, further comprising:

a plurality of first conductive lines extending along a third direction and connecting the first conductive pillars, wherein the third direction is perpendicular to the first direction; and a plurality of second conductive lines extending along the third direction and connecting the second conductive pillars.

3. The three-dimensional AND flash memory device according to claim 2, wherein the first conductive lines and the second conductive lines are alternately disposed along the first direction.

4. The three-dimensional AND flash memory device according to claim 2, wherein each of the channel pillars is crossed over by two first conductive lines and two second conductive lines.

5. The three-dimensional AND flash memory device according to claim 2, wherein the first conductive pillars of a same row in a same sub-block are arranged along the first direction, and the second conductive pillars of a same row in a same sub-block are arranged along the first direction.

6. The three-dimensional AND flash memory device according to claim 2, wherein in a same sub-block, the first conductive pillars are staggered with the second conductive pillars in adjacent rows in the third direction.

7. The three-dimensional AND flash memory device according to claim 2, wherein the first conductive pillars of an $n^{th}$ row of two adjacent sub-blocks are arranged along the third direction and are connected to a same first conductive line, and the second conductive pillars of the $n^{th}$ row of the two adjacent sub-blocks are arranged along the third direction and are connected to a same second conductive line.

8. The three-dimensional AND flash memory device according to claim 1, wherein the acute angle is 55 degrees.

* * * * *